(12) United States Patent
Hsu et al.

(10) Patent No.: US 7,790,522 B2
(45) Date of Patent: Sep. 7, 2010

(54) DEFECT-FREE HYBRID ORIENTATION TECHNOLOGY FOR SEMICONDUCTOR DEVICES

(75) Inventors: Louis C. Hsu, Fishkill, NY (US); Rajiv V. Joshi, Yorktown Heights, NY (US); Xu Ouyang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/543,630

(22) Filed: Aug. 19, 2009

(65) Prior Publication Data

US 2009/0305472 A1 Dec. 10, 2009

Related U.S. Application Data

(62) Division of application No. 11/682,403, filed on Mar. 6, 2007.

(51) Int. Cl.
*H01L 21/00* (2006.01)

(52) U.S. Cl. ............... 438/150; 438/155; 257/627; 257/E21.561

(58) Field of Classification Search ........... 438/150, 438/155; 257/627, E21.561
See application file for complete search history.

(56) References Cited

U.S. PATENT DOCUMENTS

| 6,815,278 | B1 | 11/2004 | Ieong et al. | |
|---|---|---|---|---|
| 6,995,456 | B2 | 2/2006 | Nowak | |
| 2007/0187682 | A1 * | 8/2007 | Takeuchi et al. | .............. 257/64 |

OTHER PUBLICATIONS

Yang, et al., "High Performance CMOS Fabricated on Hybrid Substrate with Different Crystal Orientations", IEEE: 2003; pp. 18.7.1-18.7.4.
Yang, et al., "On the Integration of CMOS with Hybrid Crystal Orientations"; 2004 Symposium on VLSI Technology Digest of Technical Papers; 2004 IEEE: pp. 160-161.

* cited by examiner

*Primary Examiner*—Davienne Monbleau
*Assistant Examiner*—Farid Khan
(74) *Attorney, Agent, or Firm*—Tutunjian & Bitetto, P.C.; Brian Verminski, Esq.

(57) ABSTRACT

A semiconductor device includes a semiconductor material having two crystal orientations. The semiconductor material forms an active area of the device. A device channel is formed on the two crystal orientations, which include a first region formed in a first crystal orientation surface of the semiconductor material, and a second region formed in a second crystal orientation surface of the semiconductor material wherein the first crystal orientation surface forms an angle with the second crystal orientation surface and the device channel covers at least an intersection of the angle.

9 Claims, 25 Drawing Sheets

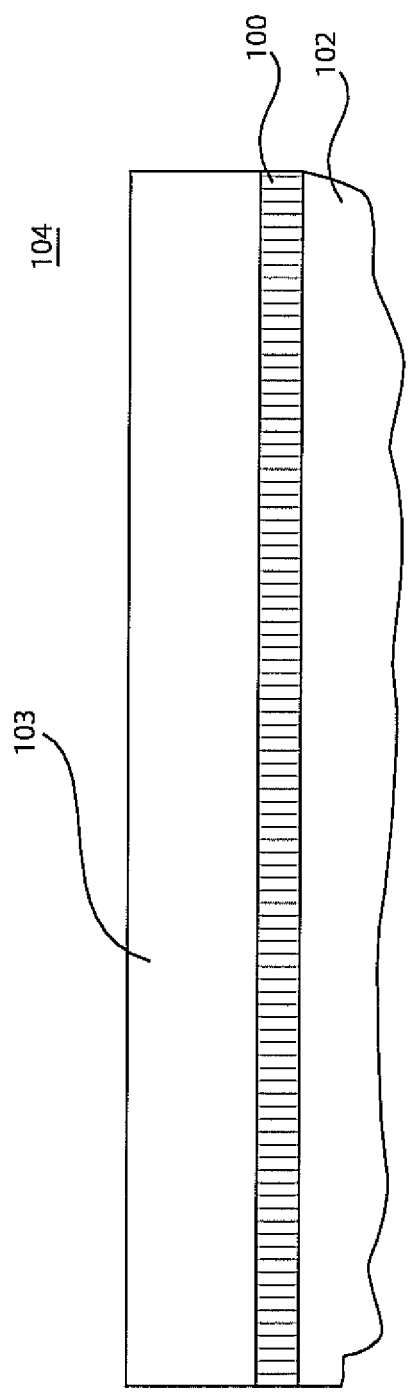
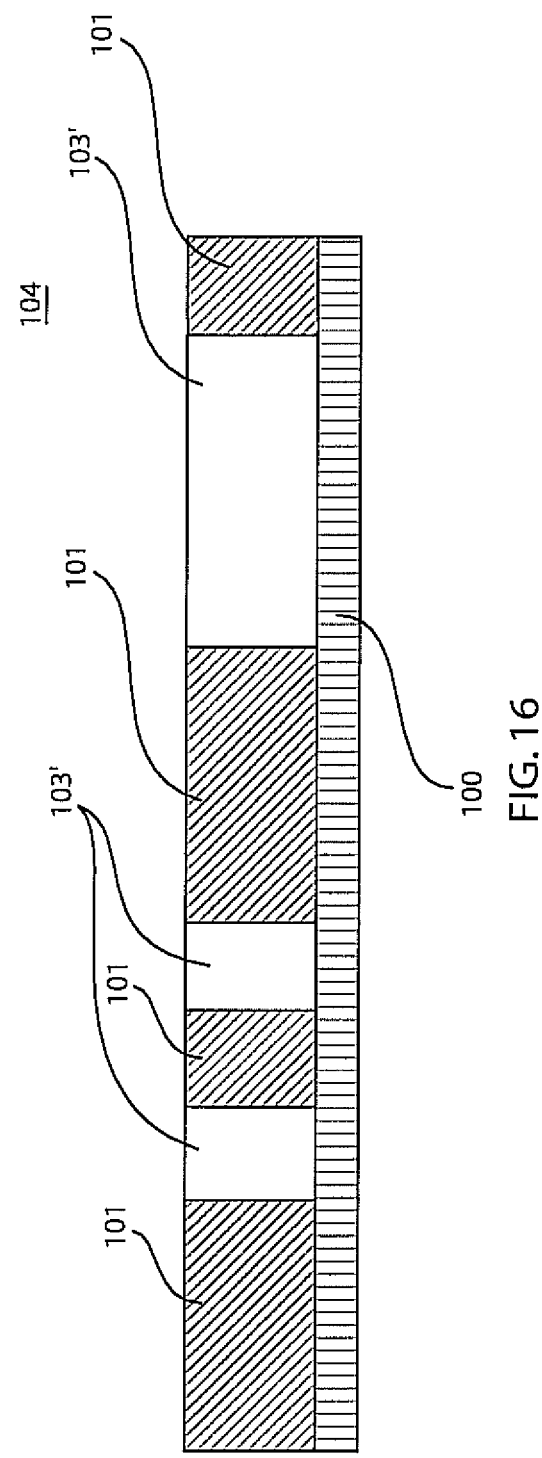
FIG. 15
FIG. 16

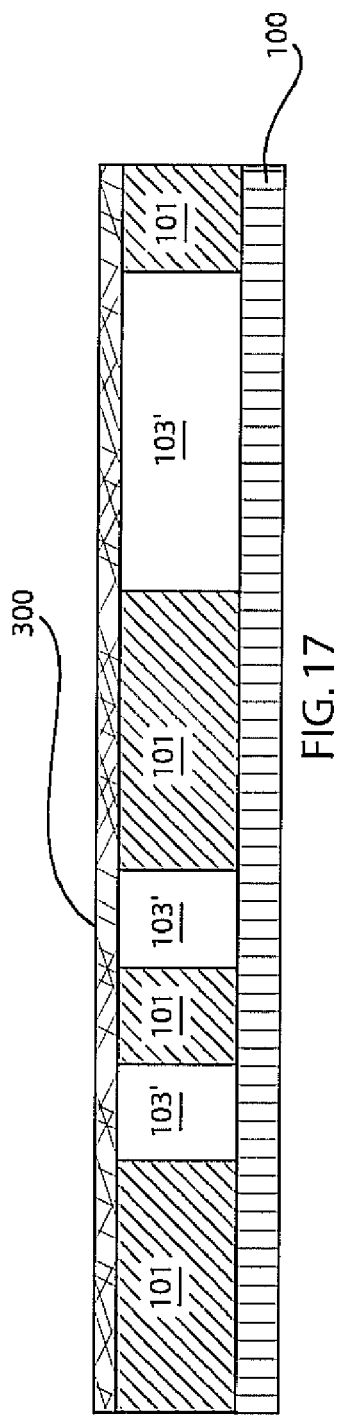
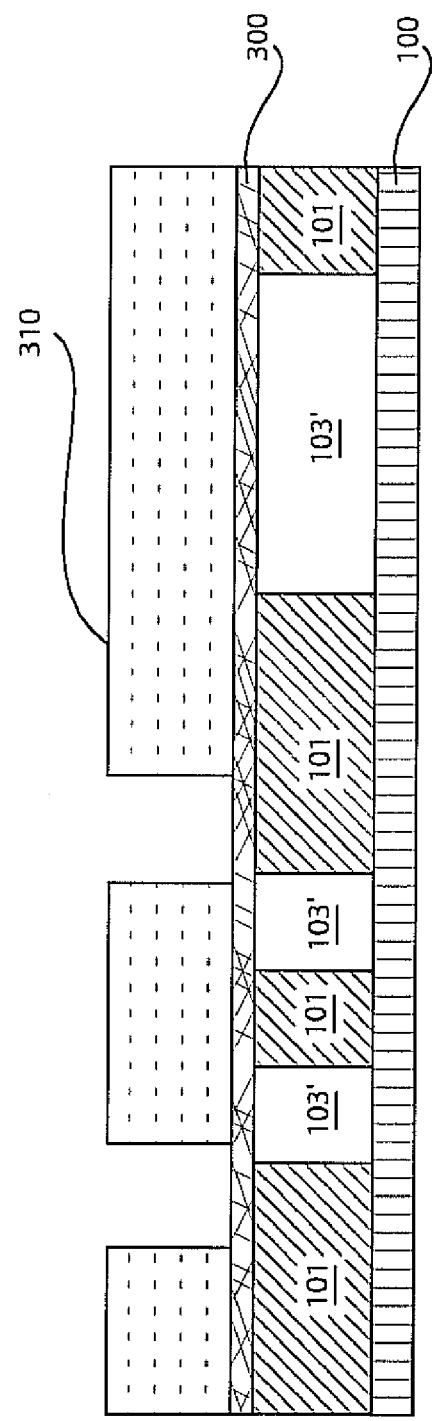
FIG. 17
FIG. 18

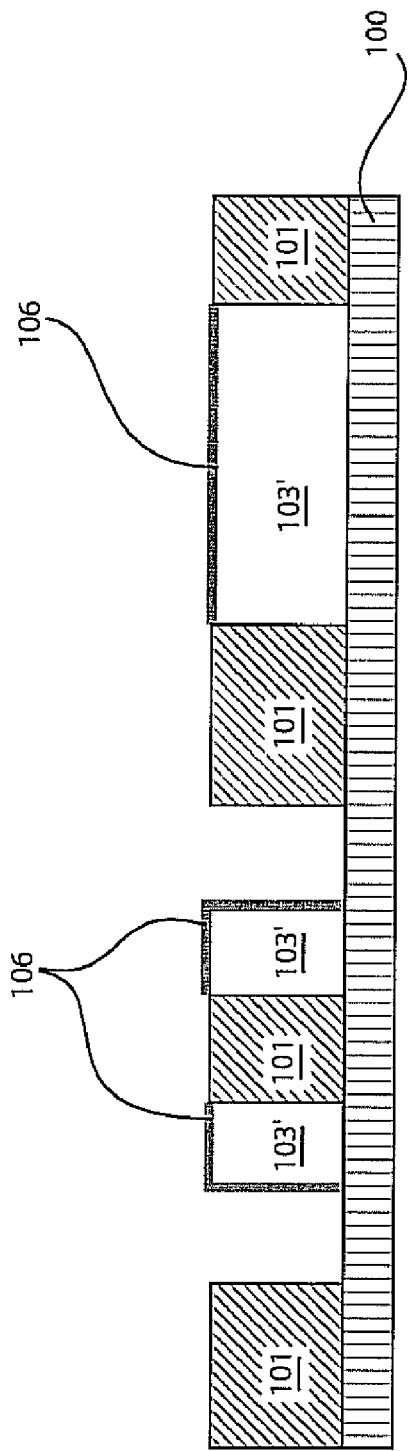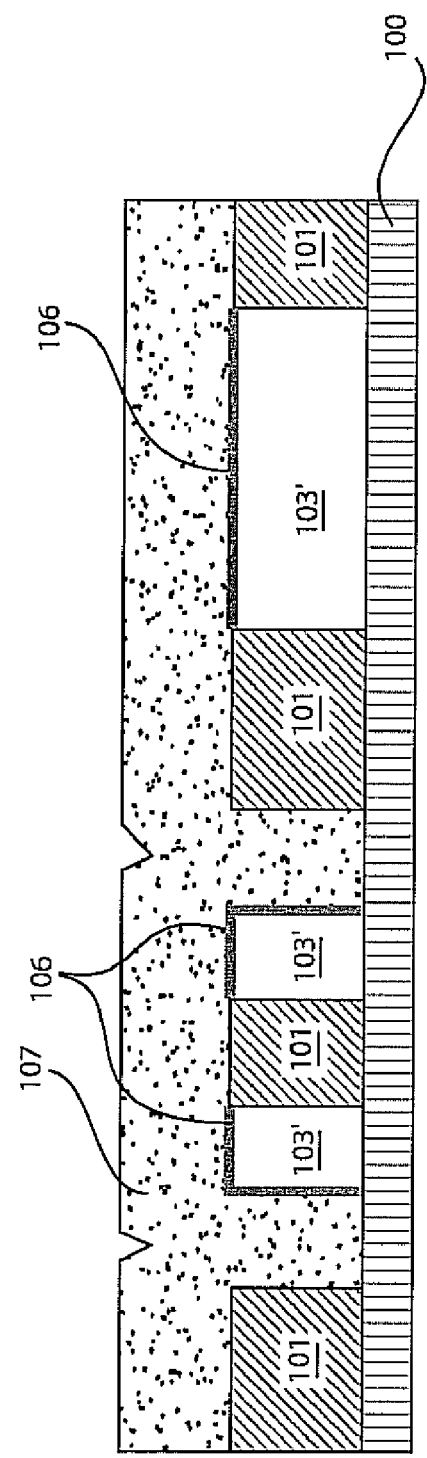

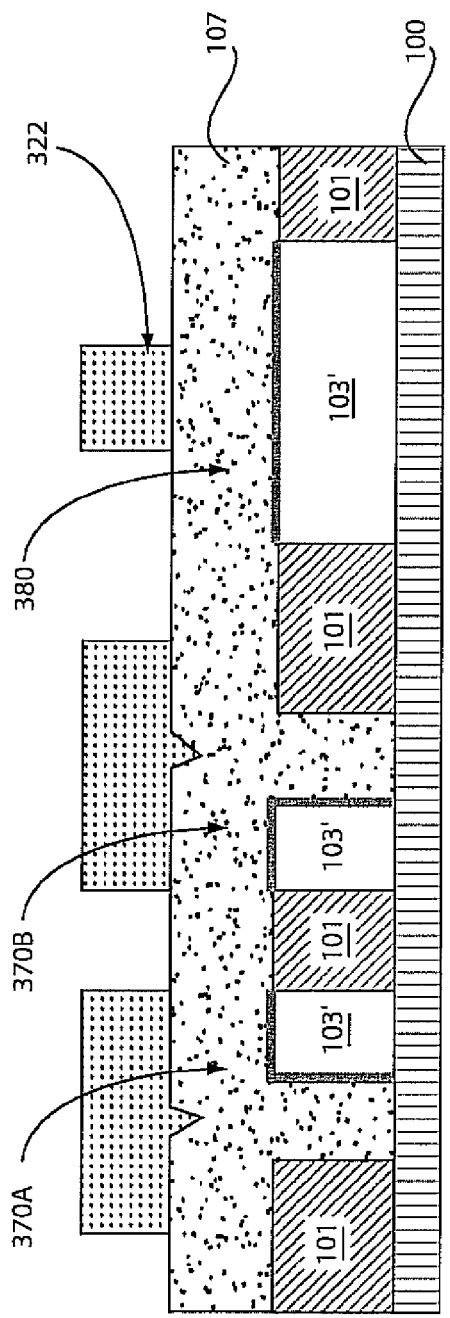
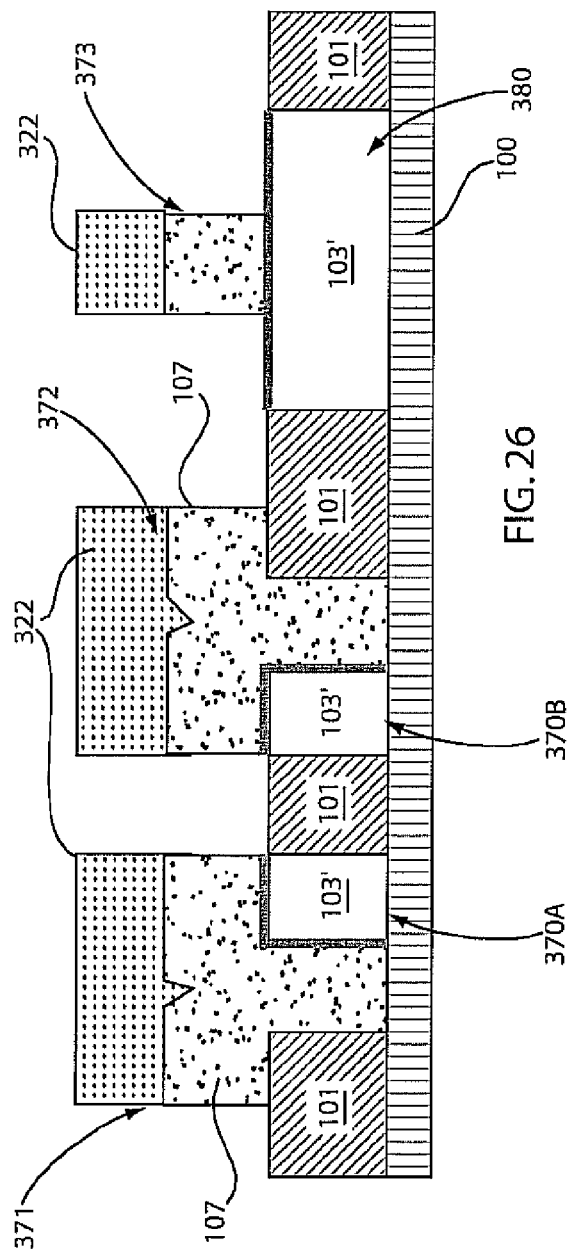

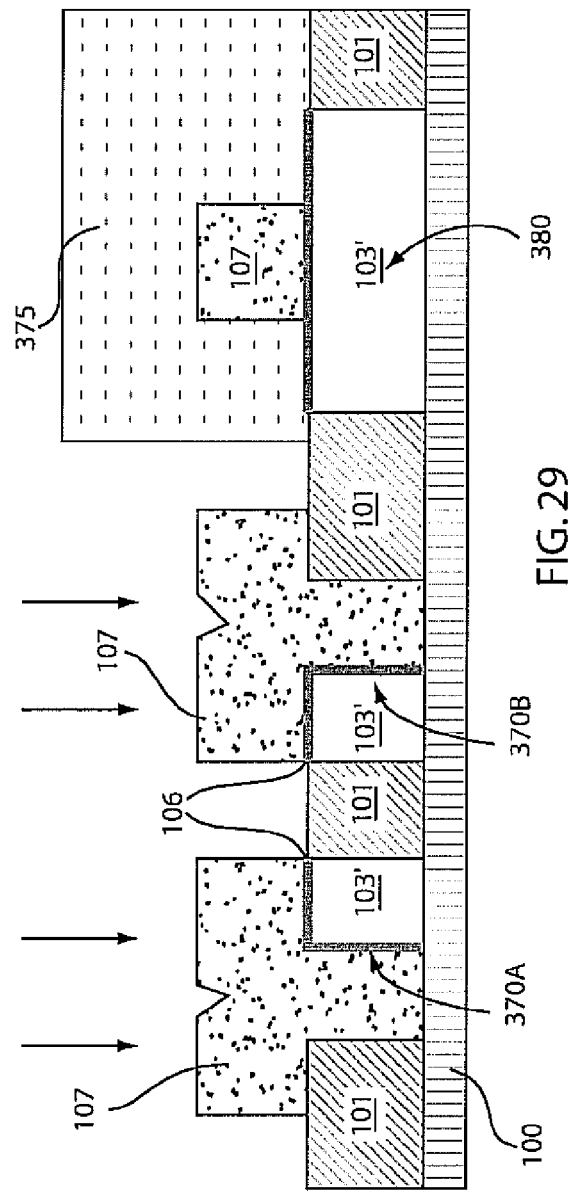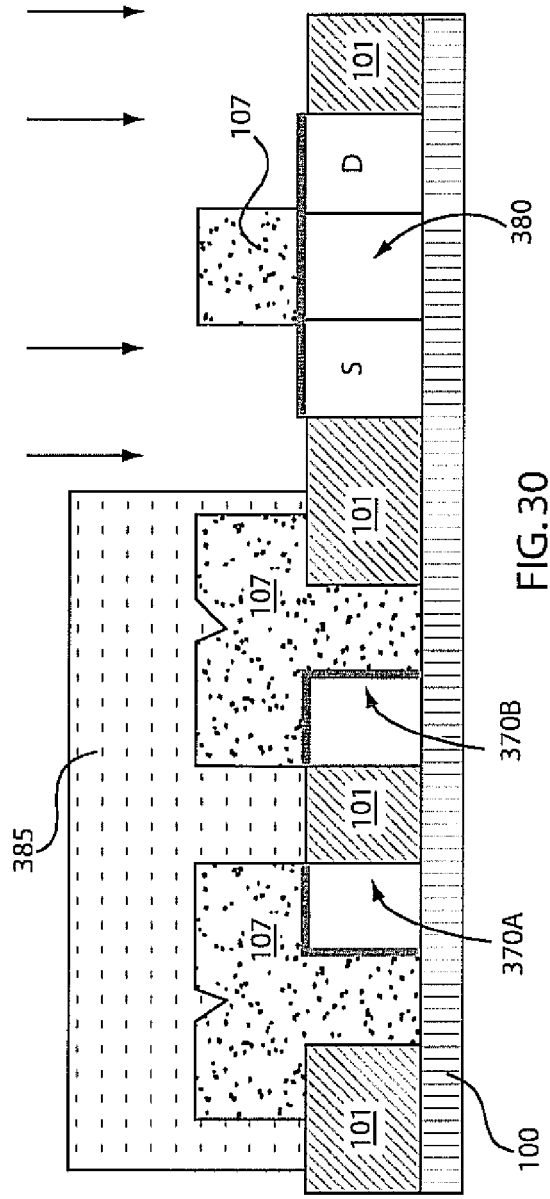

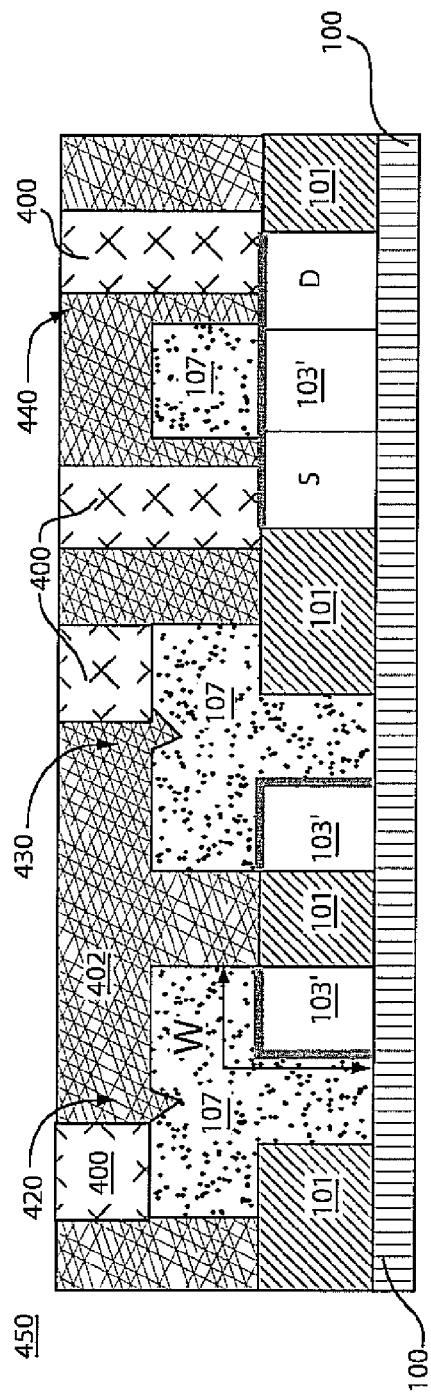
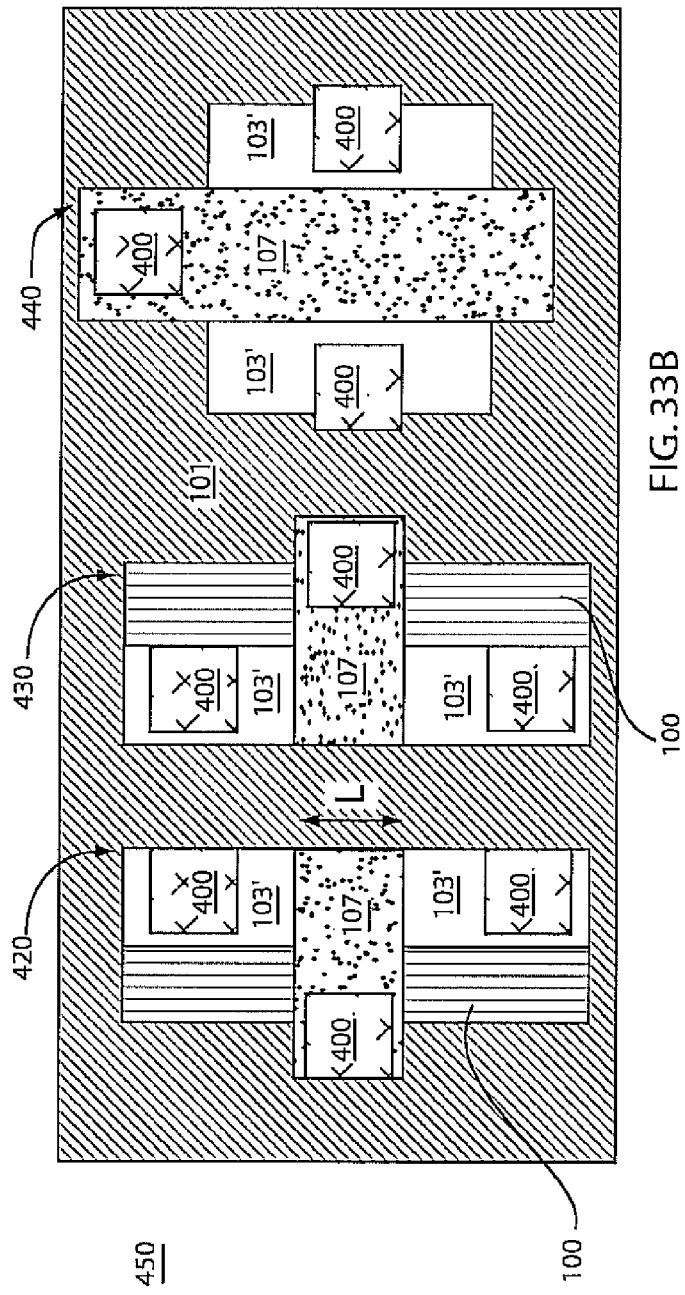
FIG. 33A
FIG. 33B

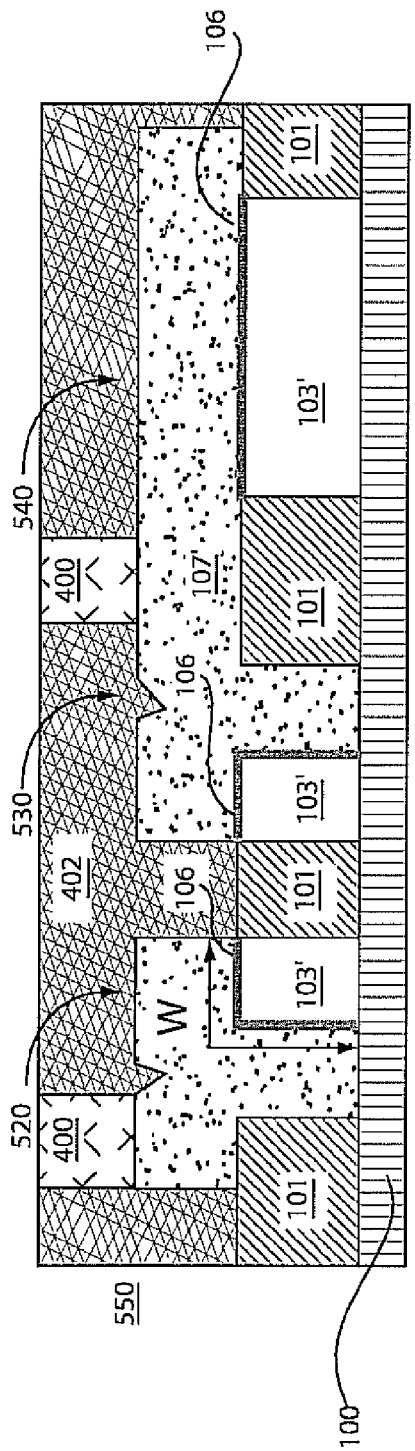
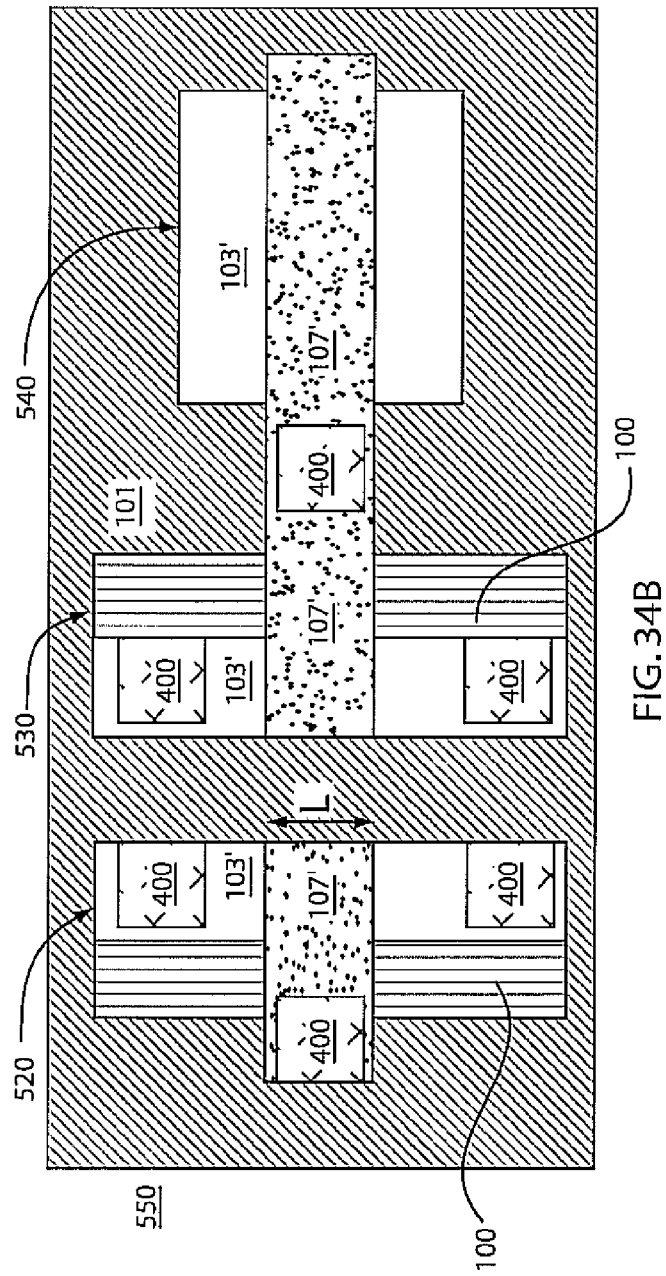
FIG. 34A
FIG. 34B

DEFECT-FREE HYBRID ORIENTATION TECHNOLOGY FOR SEMICONDUCTOR DEVICES

RELATED APPLICATION INFORMATION

This application is a Divisional application of U.S. patent application Ser. No. 11/682,403 filed on Mar. 6, 2007, incorporated herein by reference in its entirety.

BACKGROUND

1. Technical Field

The present invention relates to semiconductors and semiconductor manufacturing, and more particularly to employing hybrid orientation technology (HOT), and integrated devices on a hybrid orientated substrate.

2. Description of the Related Art

Hybrid Orientation Technology (HOT) provides an attractive scalability path for enhanced performance of complementary metal oxide semiconductors (CMOS) at and below the 45 nm technology node. By providing a substrate having regions of different crystal orientation, where each orientation is optimized for the mobility of a particular type of metal oxide semiconductor field effect transistor (MOSFET), significant improvements in overall performance may be achieved. Hybrid orientation technology takes advantage of the fact that pFET transistors operate best when fabricated on silicon with a (110) orientation, while nFET transistors operate best with a (100) orientation (the orientation of most substrates). For pFETs, hole mobility is 2.5 times higher on (110) surface orientation compared with that on a standard wafer with (100) surface orientation.

Several prior art approaches for achieving MOSFETs formed in different crystallographically oriented regions have been explored. For example, "High-Performance CMOS Fabricated on Hybrid Substrate with Different Crystal Orientations," M. Yang, et al, IEEE IEDM, 2003 and "On the Integration of CMOS with Hybrid Crystal Orientations," IEEE VLSI Tech Symposium, 2004), both provide a semiconductor substrate comprising distinct planar regions of different crystal orientation. Additionally, hybrid orientation technology has been described in the prior art, for example, in U.S. Pat. No. 6,815,278 to Leong et al. Leong et al. describes integrated semiconductor devices that are formed upon a silicon-on-insulator (SOI) substrate having different crystal orientations that provide optimal performance for a specific device. Another example includes U.S. Pat. No. 6,995,456 to Nowak.

Referring to FIG. 1, an integrated structure 10 using a conventional approach is illustratively shown. NMOS devices 12 are built on a (100) substrate 14 of a SOI wafer, and pMOS devices 16 are fabricated on a substrate which is grown from a carrier substrate 18 with (110) orientation. Defect zones 20 are found at edges of the opening for epitaxial growth. These defect zones 20 occupy a high percentage of valuable real estate. This method becomes impractical for CMOS circuits where 50% of the area is formed by PMOS devices which are mingled with the NMOS devices. The waste area is roughly estimated to be from 10% to 25%.

The prior art fails to address, among other things, the specific classes of defects that arise due to the specific methods of fabricating hybrid orientation silicon substrates. Furthermore, the means for detecting, modeling, and reducing such defects during the mass manufacturing of such structures is neglected.

Most of the previously published methods for fabricating hybrid orientation substrates and those under development today involve bonding two silicon wafers with different crystal orientations to form an upper silicon layer with a first crystal orientation on a lower silicon substrate with a second crystal orientation, removing a portion of the upper silicon layer, and epitaxially re-growing silicon from the lower silicon substrate. Such an approach has several disadvantages, among which the severe defect issue prevents the hybrid orientation technology from being successfully adopted in mass production. Data has consistently shown that a large number of defects are undesirably formed during the epitaxial growth process.

Although most of these defects are localized at the interface between the two differently crystal-oriented regions and therefore can be eliminated in a subsequent isolation structure 22 formation process (e.g., shallow trench isolation (STI), some defects propagate into the re-grown region where active devices are formed. Interface defects and defects propagating into the epi re-grown regions are commonplace in prior art devices.

These above-mentioned defects in the epi regions have detrimental effects on device performance and reliability. Devices fabricated with a prior art hybrid orientation technology suffer increased gate oxide leakage due to propagated crystal defects in (110) oriented epi grown PFETs compared with devices fabricated without hybrid orientation technology.

SUMMARY

A semiconductor device includes a semiconductor material having two crystal orientations. The semiconductor material forms an active area of the device. A device channel is formed on the two crystal orientations, which include a first region formed in a first crystal orientation surface of the semiconductor material, and a second region formed in a second crystal orientation surface of the semiconductor material wherein the first crystal orientation surface forms an angle with the second crystal orientation surface and the device channel covers at least an intersection of the angle.

A method for forming an angle device includes forming a silicon island surrounded by an isolation region on a silicon-on-insulator (SOI) wafer, forming a cavity adjacent to the silicon island to expose at least two silicon surfaces where each surface has a different crystallographic orientation, forming a gate oxide on the least two silicon surfaces to define a device channel such that the device channel extends over the at least two silicon surfaces and forming a gate conductor by depositing the gate conductor over the at least two silicon surfaces. In one embodiment, the (100) and (110) channel dimensions may be tuned by the fabrication process or by trimming the gate conductor.

A method for integrating angle devices and planar devices on a same chip includes forming a plurality of silicon islands surrounded by isolation regions on a silicon-on-insulator (SOI) wafer, forming a plurality of cavities adjacent to the silicon islands to expose at least two silicon surfaces where each surface has a different crystallographic orientation, forming a gate oxide on the least two silicon surfaces to define a device channel such that the device channel extends over the at least two silicon surface for angle devices and one of the at least two silicon surfaces for planar device and forming gate conductors for the angle devices by depositing the gate conductors over the at least two silicon surfaces and concurrently forming gate conductors for the planar devices by depositing the gate conductors over one of the at least two silicon surfaces.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 15 is a cross-sectional view of a silicon-on-insulator wafer used in forming integrated angle devices (e.g., PMOS) and planar devices (e.g., NMOS);

FIG. 16 is a cross-sectional view of the device of FIG. 15 showing silicon islands and isolation structures formed therebetween;

FIG. 17 is a cross-sectional view of the device of FIG. 16 showing a cap layer formed;

FIG. 18 is a cross-sectional view of the device of FIG. 17 showing a dielectric layer patterned over the cap layer to form cavities in the isolation structures (e.g., STI);

FIG. 23 is a cross-sectional view of the device of FIG. 22 showing the formation of a gate oxide on the silicon islands for both angle devices and planar devices;

FIG. 24 is a cross-sectional view of the device of FIG. 23 showing the deposition of a gate conductor;

FIG. 25 is a cross-sectional view of the device of FIG. 24 showing the deposition of a gate conductor patterning mask;

FIG. 26 is a cross-sectional view of the device of FIG. 25 showing the patterning of the gate conductor;

FIG. 29 is a cross-sectional view of the device of FIG. 26 showing a block mask for protecting the planar devices during implantation of sources and drains of the angle devices;

FIG. 30 is a cross-sectional view of the device of FIG. 29 showing a block mask for protecting the angle devices during implantation of sources and drains of the planar devices;

FIG. 33A is a cross-sectional view of a final integrated CMOS structure having an angle device, a sidewall device (vertical channel) and a planar device;

FIG. 33B is a top view of the device depicted in FIG. 33A with layers removed to provide visibility;

FIG. 34A is a cross-sectional view of a final integrated CMOS structure having an angle device and a planar device sharing a gate conductor;

FIG. 34B is a top view of the device depicted in FIG. 34A with layers removed to provide visibility;

DETAILED DESCRIPTION OF PREFERRED EMBODIMENTS

Figure 1:
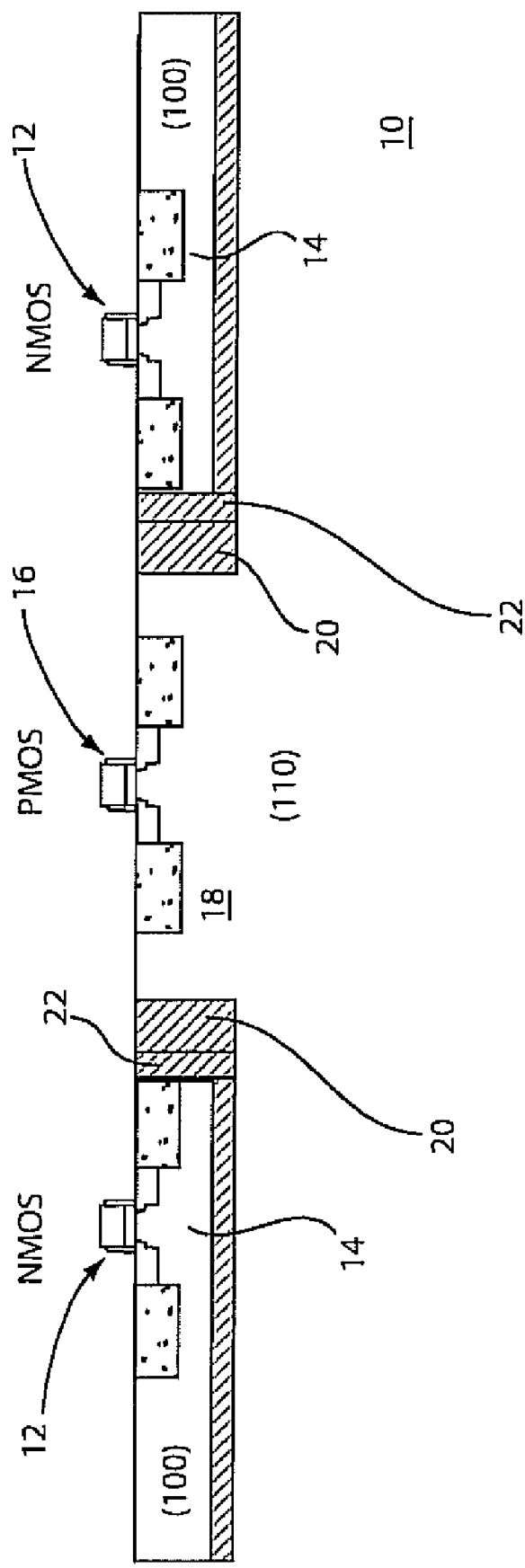
FIG. 1 shows a conventional HOT process integration with NMOS and PMOS devices formed on separate silicon substrates.

Present embodiments provide an alternative structure and method for forming hybrid oriented semiconductor devices without the defect issues encountered by the prior art. Advantageously, the present principles provide defect-free hybrid orientation devices and circuits having low gate and junction leakages. In addition, NMOS devices are provided on a standard planar (100) substrate, while PMOS devices are provided on a (110) surface using a new side-wall device technology. A MOS device is provided where a portion of the channel is formed on the (100) surface and another portion of the channel is formed on the sidewall in a (110) surface. The ratio of the first and second portions is made tunable so that the net channel conductivity can be tailored to a specific value. Crystallographic orientations will be depicted only as numbers in parenthesis, e.g., (110) or (100).

Integration methods are provided to fabricate a planar device simultaneously with a sidewall or angled device and to trim the ratio of channel region along the sidewall and surface by using a mask to remove unwanted portions of the gate after source/drain implantation is done. After trimming, a channel stop implant may be conducted.

Embodiments of the present invention can take the form of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed. The methods as described herein are preferably employed in the fabrication of such integrated circuit chips.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Hereinafter, fabrication of devices using hybrid orientation technology (HOT) will be referred to as HOT device integration. In HOT device integration in accordance with the present principles, epi-growth (or epitaxial growth) related defects are eliminated by providing a HOT technology which does not employ epi-growth. In accordance with the present embodiments, a new device structure what may be referred to as an angle-device is provided. A channel of the angle-device can be formed on one, or two surfaces having different crystal orientations. A fabrication process is also disclosed to integrate both angle-devices as well as the planar device simultaneously on a substrate, e.g., on a SOI wafer.

Figure 2A:
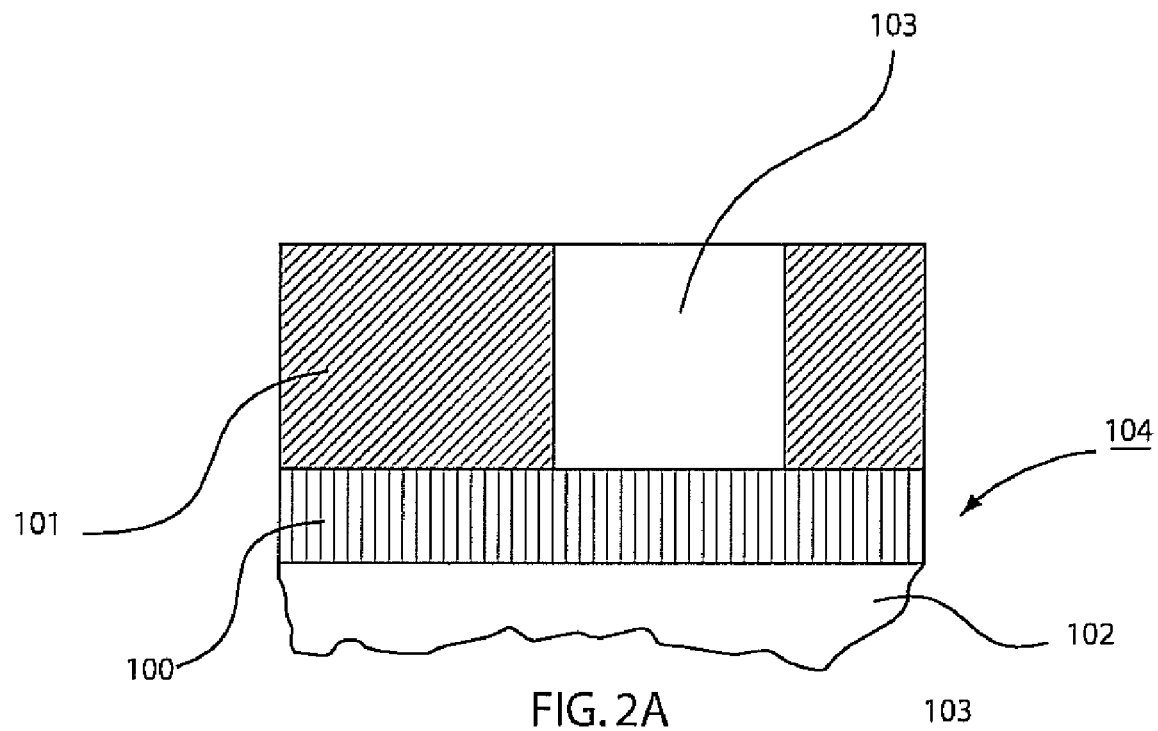
FIG. 2A is a cross-sectional view of a silicon-on-insulator wafer where a silicon island is formed.
Figure 2B:
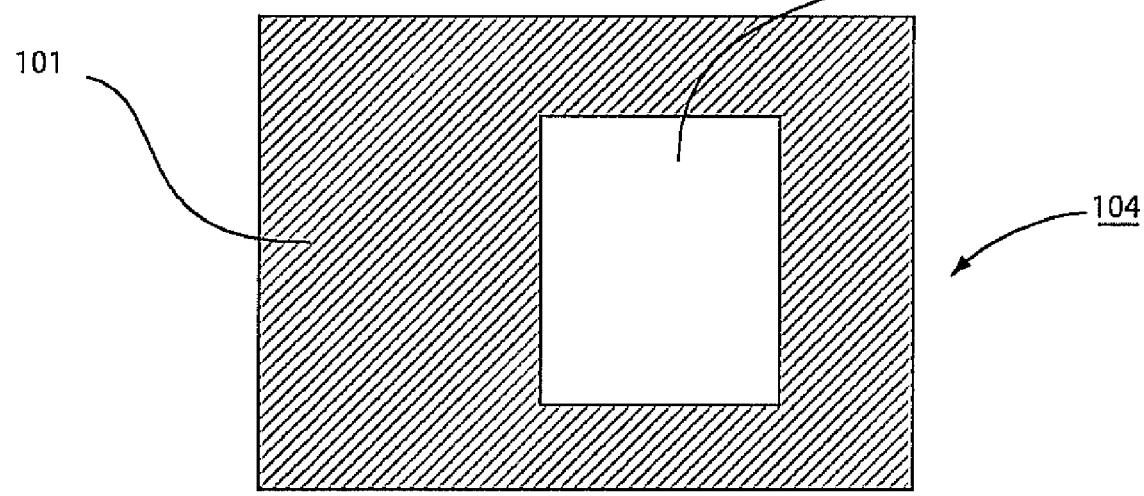
FIG. 2B is a top view of the device depicted in FIG. 2A.

Referring now to the drawings in which like numerals represent the same or similar elements and initially to FIGS. 2A and 2B, a cross-sectional view and top view are respectively shown for forming an angled device in accordance with the present principles. A silicon-on-insulator (SOI) wafer 104 includes a mono-crystalline silicon substrate 102 having a silicon oxide layer 100 (buried oxide layer) formed on substrate 102. A thin silicon layer 103 is included, which is processed on top of the buried oxide layer 100. Isolation regions 101 formed on the silicon layer 100 are formed using a conventional shallow trench isolation (STI) process. Silicon layer 103 (the active region) is thereby surrounded by the shallow trench isolation 101.

Figure 3A:
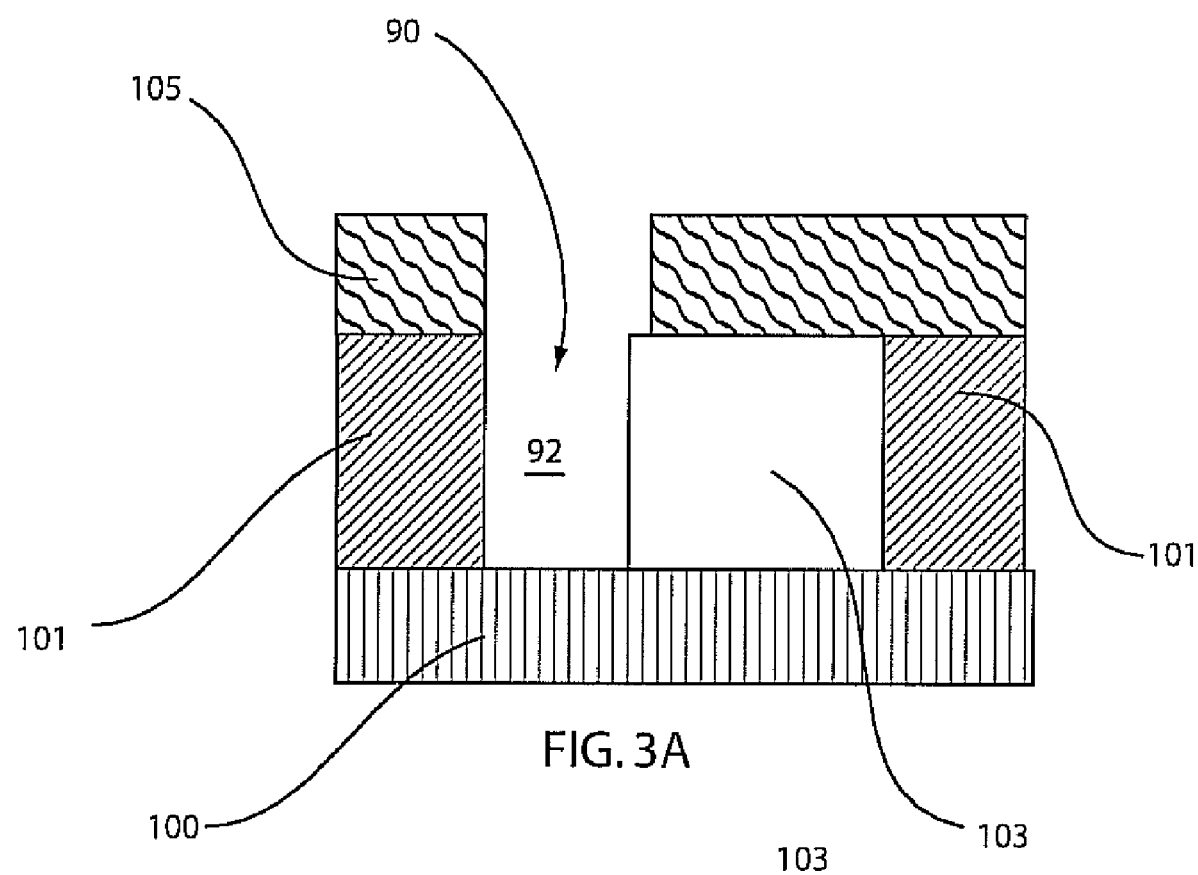
FIG. 3A is a cross-sectional view showing the device of FIG. 2A where a cavity or trench is formed adjacent to the silicon island.
Figure 3B:
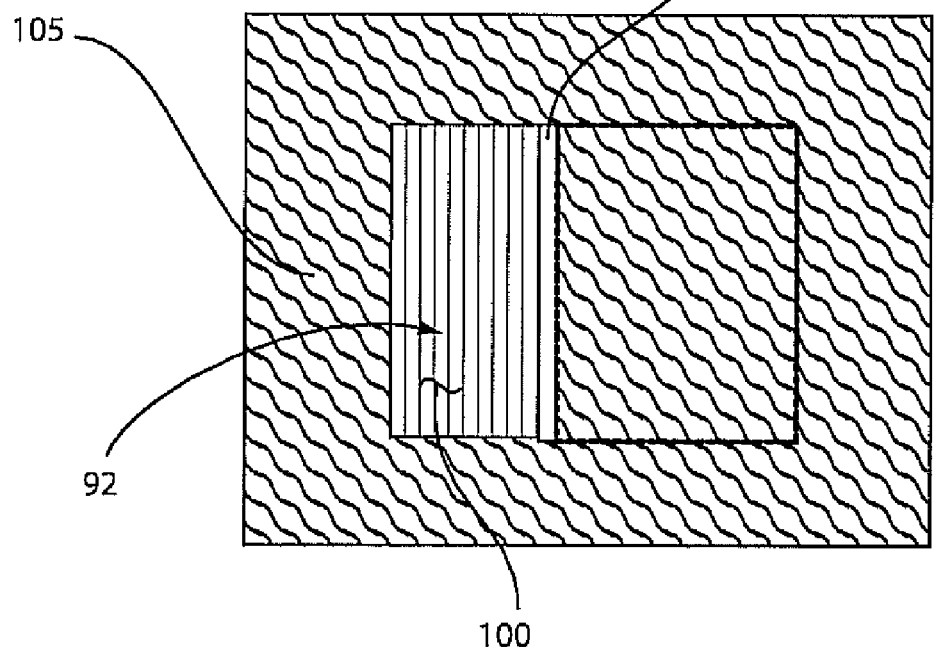
FIG. 3B is a top view of the device depicted in FIG. 3A.

Referring now to FIGS. 3A and 3B, a cross-sectional (FIG. 3A) and a top view (FIG. 3B) of a next step for forming an angled device are illustratively shown. A photo resist mask 105 is patterned to form a sidewall region of a device 90 followed by a selective etching (e.g., oxide etching) to remove the exposed STI region 101. Slightly over-etching into buried oxide layer 100 is acceptable. After etching, a rectangular shaped cavity 92 is formed self-aligned to the silicon island 103. Due to high selectivity, the silicon layer 103 is not attacked, and thus the dimension of the silicon island is not changed after etching.

Figure 4A:
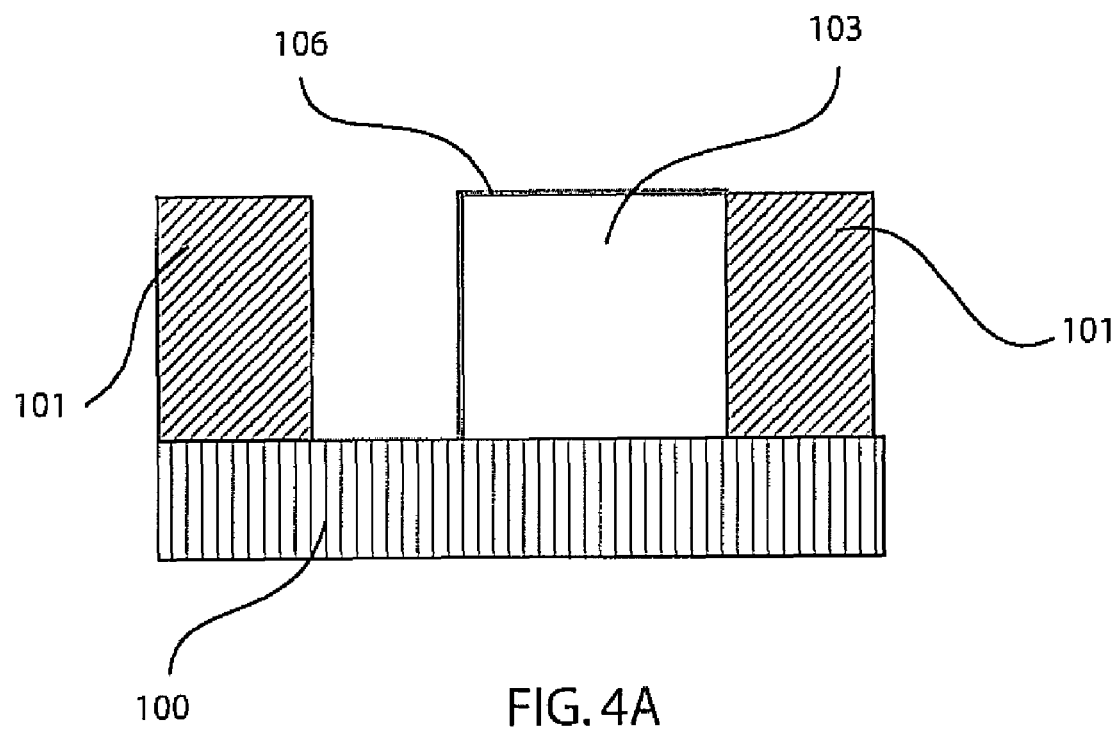
FIG. 4A is a cross-sectional view showing the device of FIG. 3A where a gate oxide is formed over two crystallographic surfaces of the silicon island.
Figure 4B:
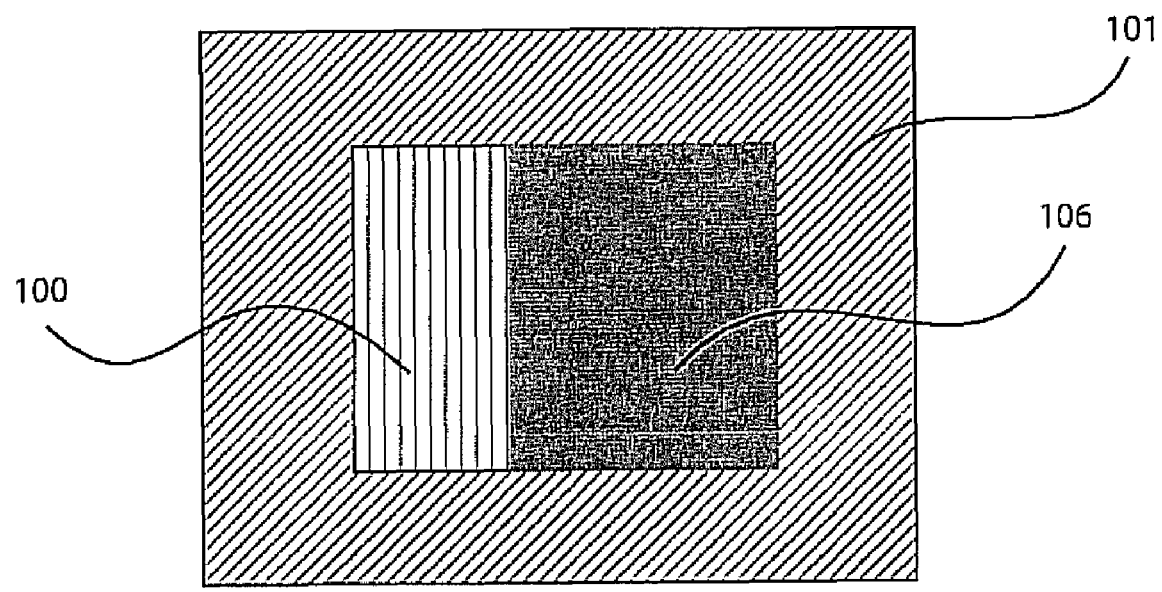
FIG. 4B is a top view of the device depicted in FIG. 4A.

Referring to FIGS. 4A and 4B, a gate oxide 106 is formed via conventional methods, such as thermal oxidation to grow a thin layer of thermal oxide on the exposed silicon surface of active area 103.

Figure 5A:
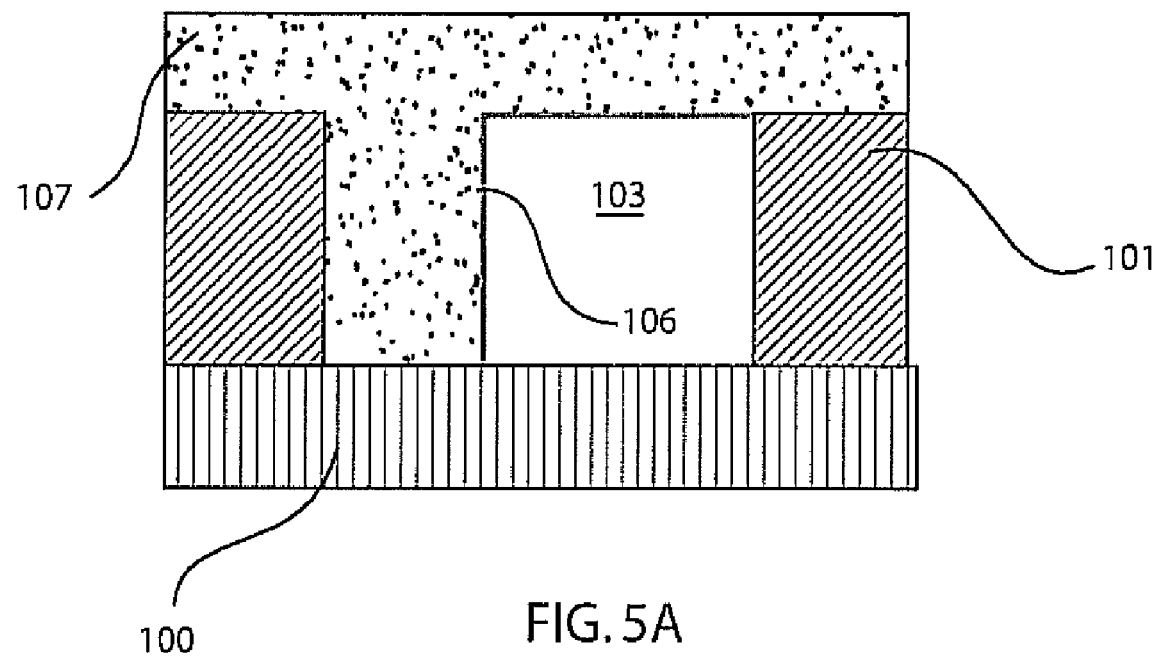
FIG. 5A is a cross-sectional view showing the device of FIG. 4A where a gate conductor is formed over the gate oxide on the two crystallographic surfaces.
Figure 5B:
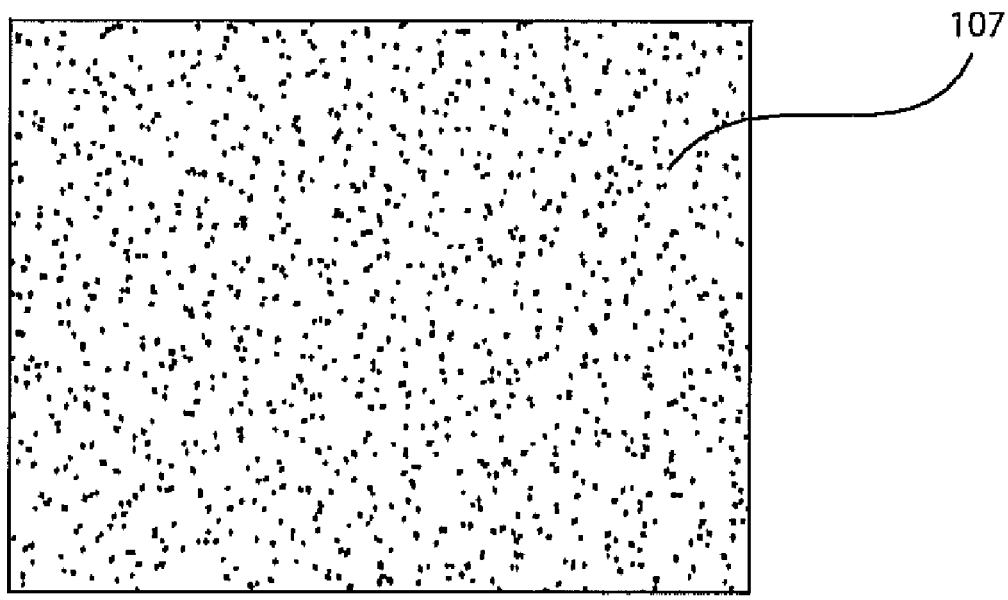
FIG. 5B is a top view of the device depicted in FIG. 5A.

Referring to FIGS. 5A and 5B, a doped poly-silicon layer 107 or other suitable material is deposited by a deposition process, such as for example, a chemical vapor deposition (CVD). Any suitable conductive material or combination of materials including metal with a proper work function may also be deposited for layer 107.

Figure 6A:
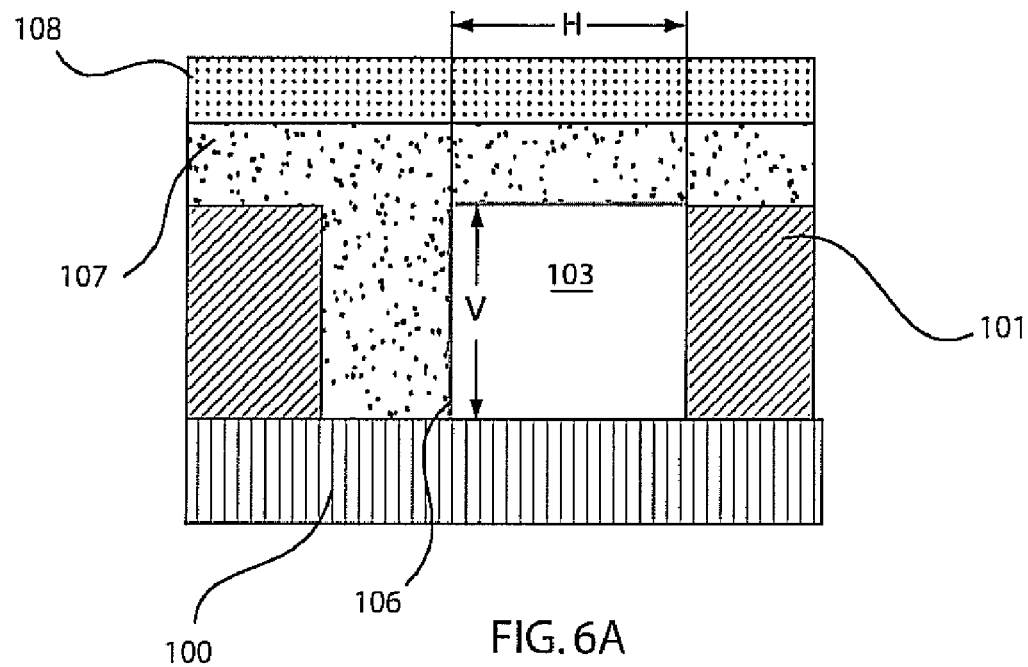
FIG. 6A is a cross-sectional view showing the device of FIG. 5A where the gate conductor is patterned.
Figure 6B:
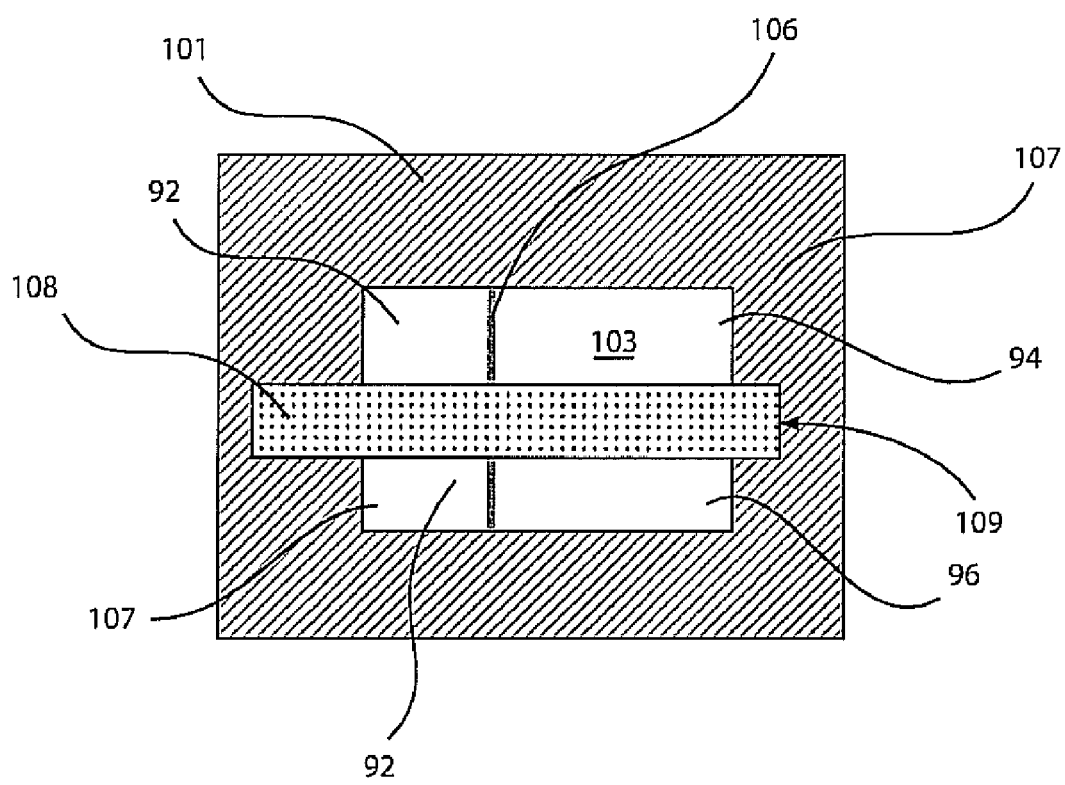
FIG. 6B is a top view of the device depicted in FIG. 6A.

Referring to FIGS. 6A and 6B, a gate mask 108 is patterned, and the conductive gate material 107 is etched to form a gate region 109. After the gate region 109 is defined, the cross-sectional shape shown in FIG. 6A comprises a 90° angle. The device includes an angled gate to form an angled gate device. Over-etching is preferable to ensure that all the residual gate material inside the cavity 92 is removed and cleaned on each side of the gate region 109. A source/drain implant is carried out to dope and form source and drain regions 94 and 96 in active region 103.

It is also conceivable that a lightly doped drain (LDD) can be formed by using a sidewall spacer (not shown) similar to that of a conventional planar device. The sidewall spacer may be formed on sidewalls of the gate material 107 over doped regions 94 and 96.

The angled gate has a vertical channel width "V" which is equivalent to the thickness of the silicon layer 103, and a horizontal channel width "H" which is the width of the silicon island 103. FIGS. 7A-9B are optional steps which permit a designer to trim the "H" portion of the channel width.

Figure 7A:
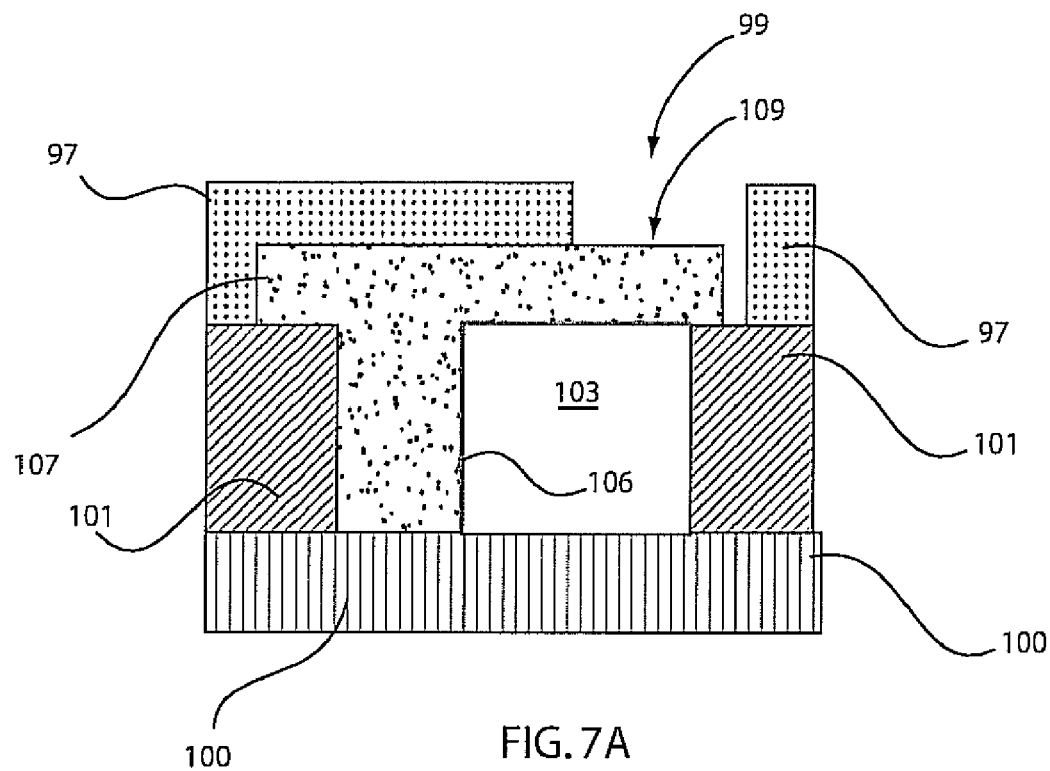
FIG. 7A is a cross-sectional view showing the device of FIG. 6A where the gate conductor is optionally exposed for trimming and trimmed to reduce channel width.
Figure 7B:
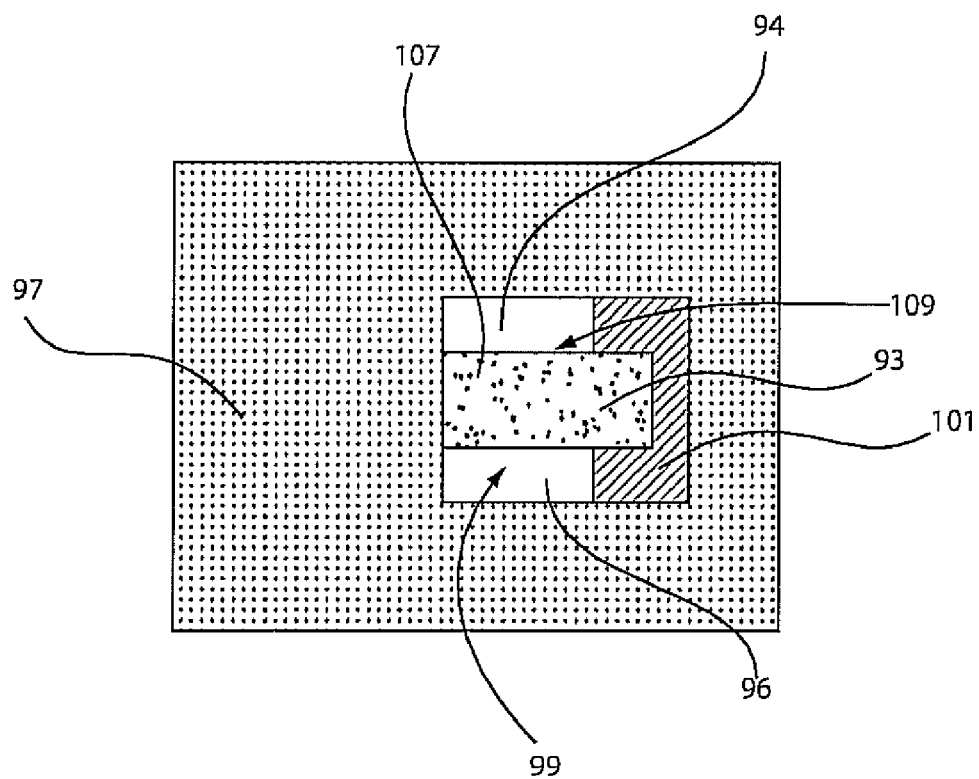
FIG. 7B is a top view of the device depicted in FIG. 7A.
Figure 8A:
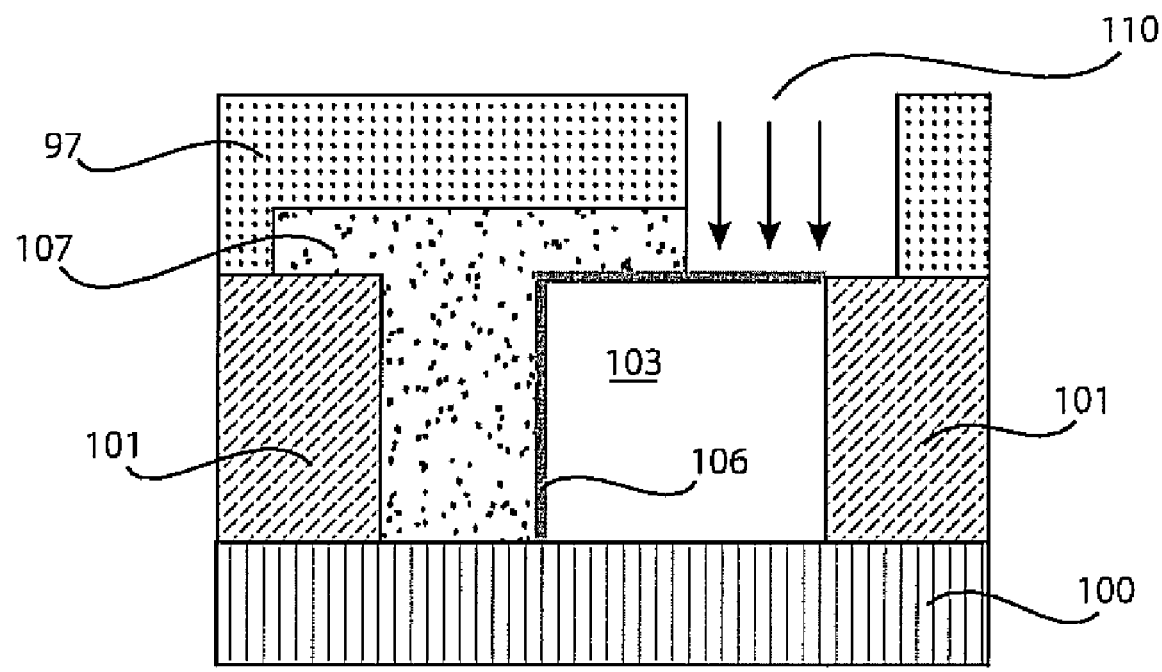
FIG. 8A is a cross-sectional view showing the device of FIG. 7A where an implantation step is performed to prevent leakage of the trimmed channel.
Figure 8B:
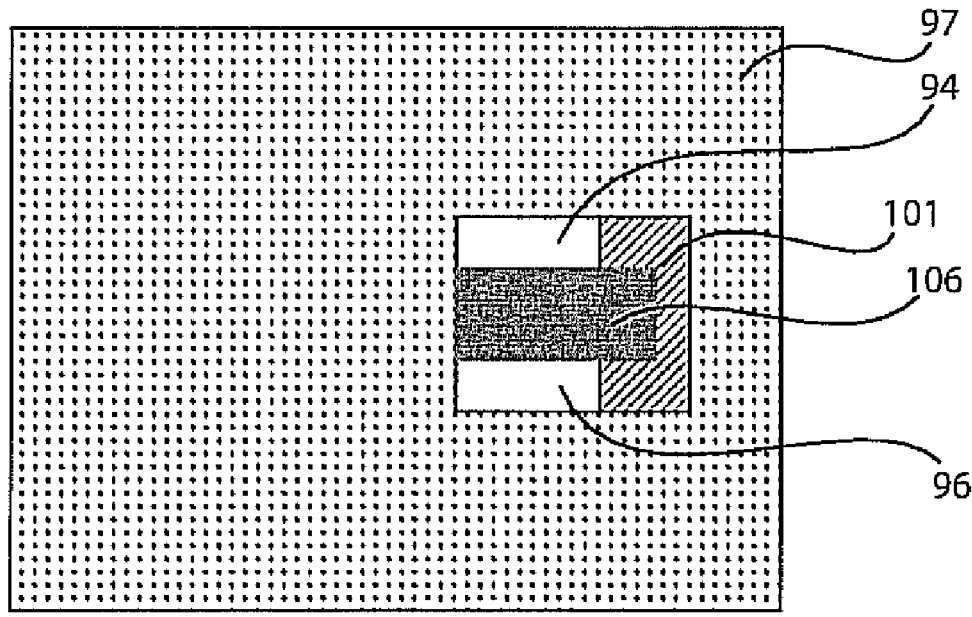
FIG. 8B is a top view of the device depicted in FIG. 8A.
Figure 9A:
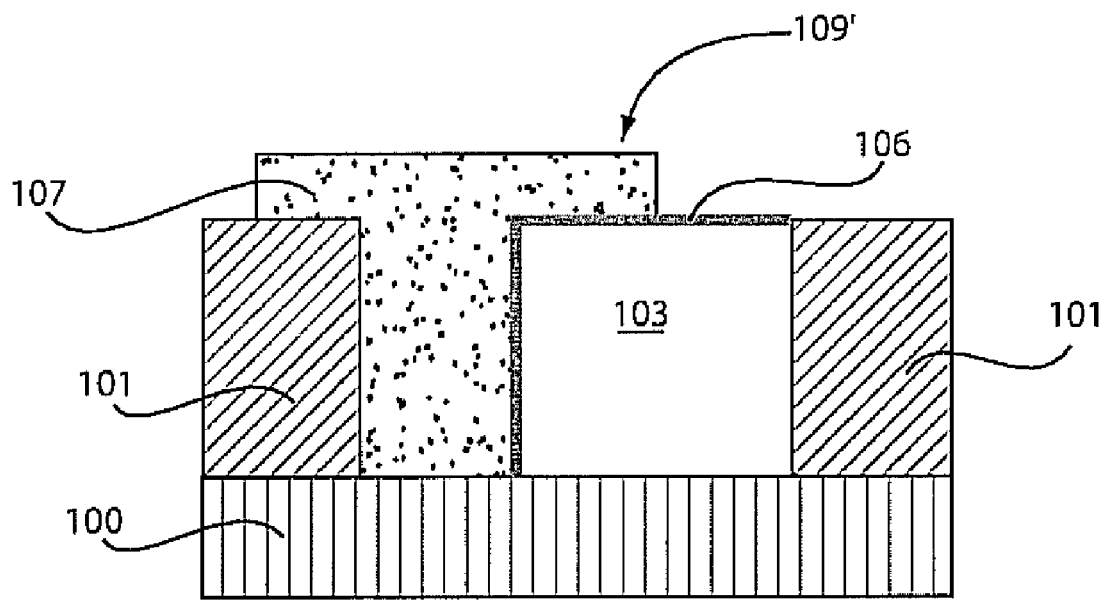
FIG. 9A is a cross-sectional view showing the device of FIG. 8A where trim mask is removed after the implantation of dopants.
Figure 9B:
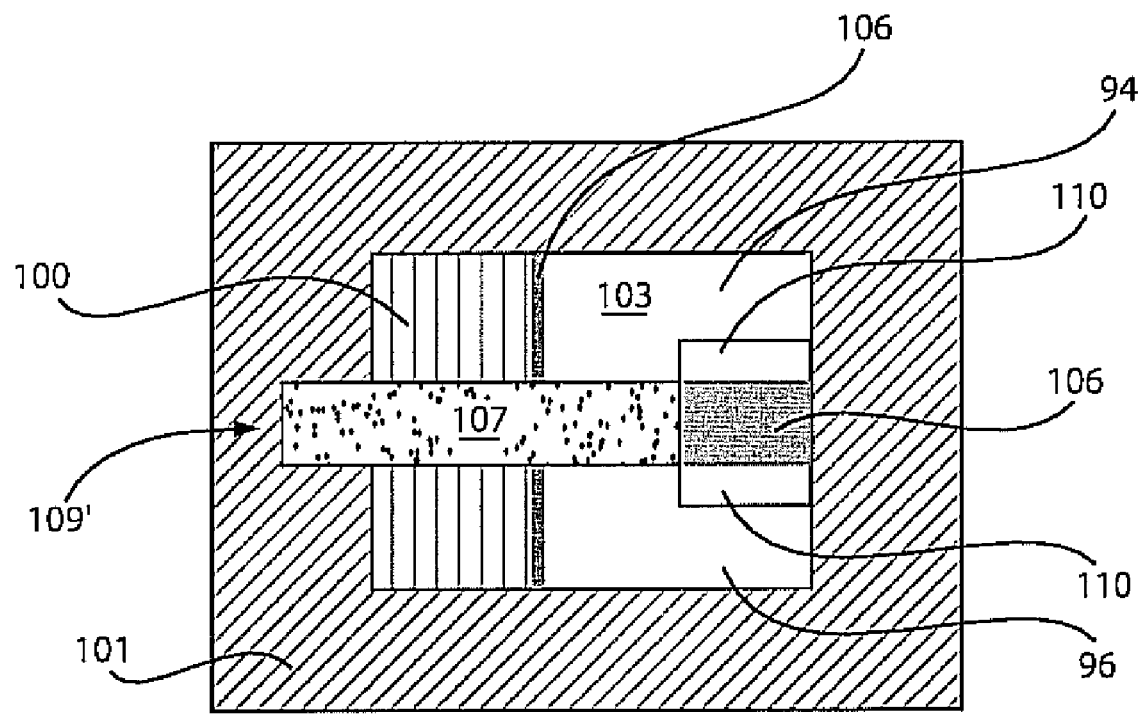
FIG. 9B is a top view of the device depicted in FIG. 9A.

Referring to FIGS. 7A and 7B, since source/drain regions 94 and 96 are already formed, a portion of the gate region 109 at a horizontal surface can be removed by using a trim mask 97 and etching away a designated portion to form a window 99. In FIGS. 8A and 8B, further etching is employed to remove a portion 93 of conductor 107 from gate region 109. After the portion 93 of the conductor 107 is removed from window 99, a channel stop implant 110 can be used to prevent leakage. In FIGS. 9A and 9B, trim mask 97 is removed and a trimmed gate region 109' is provided.

Advantageously, many variations and adjustments may be made to devices in accordance with the present principles. Some examples are provided in the following FIGS.

Figure 10:
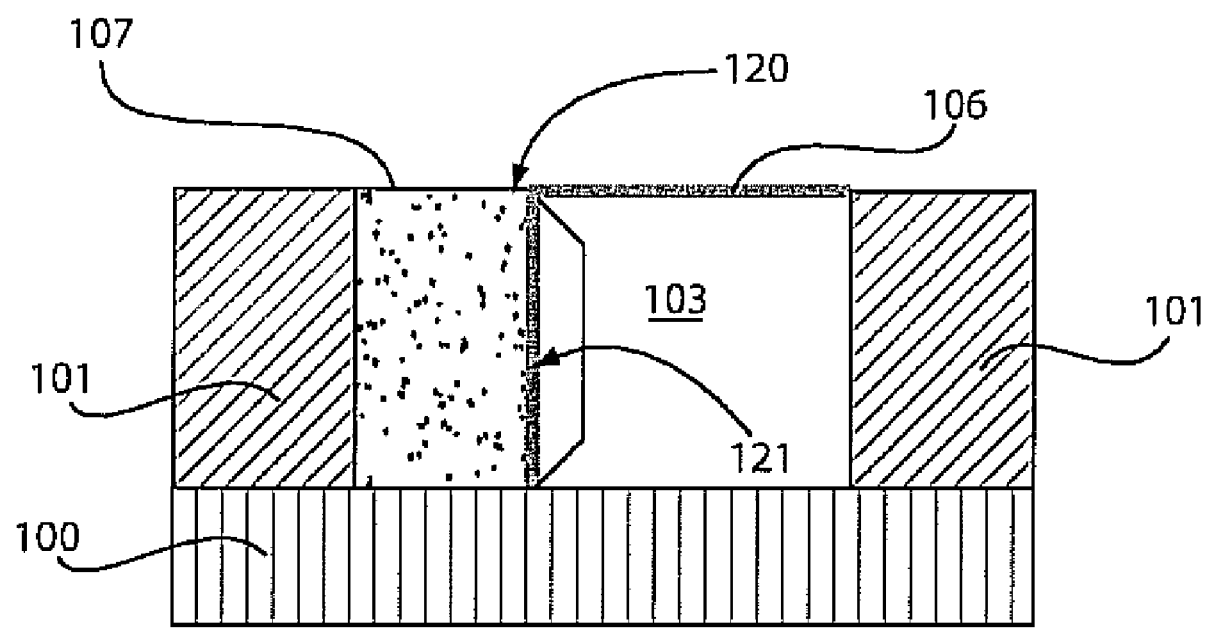
FIG. 10 is a cross-sectional view showing the device of FIG. 7A where the gate conductor is completely removed from the horizontal surface of the silicon island such that the channel is completely on the (110) surface.

Referring to FIG. 10, a sidewall gate structure 120 is illustratively shown. In this case, the top portion of the gate is completely removed. The channel forms only on a sidewall 121 having a (110) surface orientation.

Figure 12:
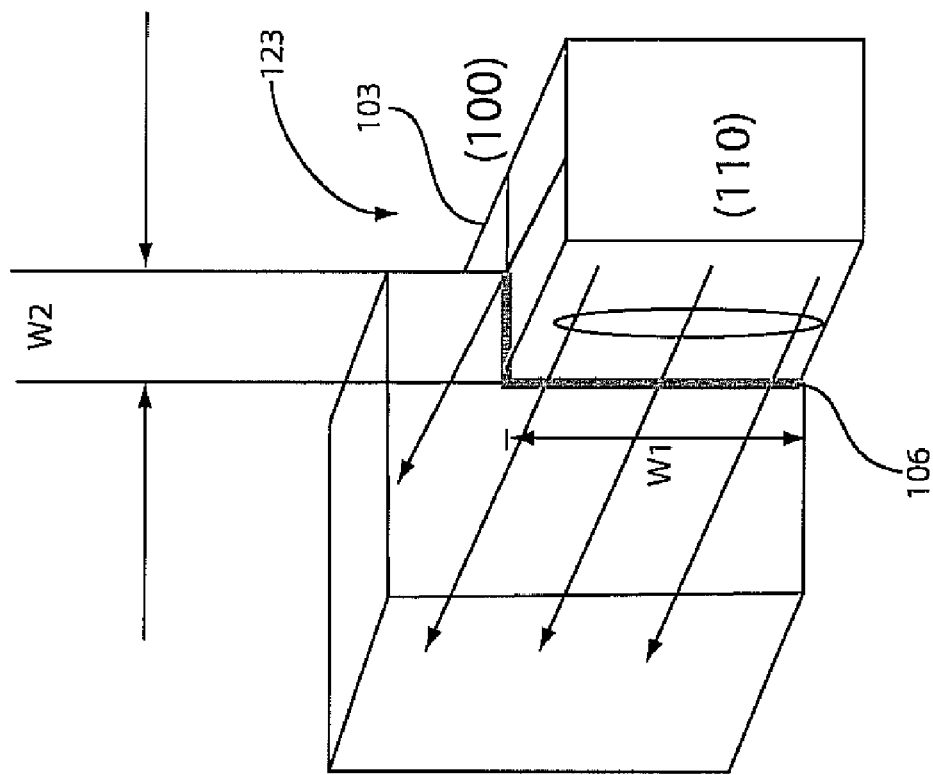
FIG. 12 is a perspective view showing an angle device where the gate conductor is included on both the vertical surface of the silicon island (the (110) surface) and the horizontal surface (the (100) surface)
Figure 11:
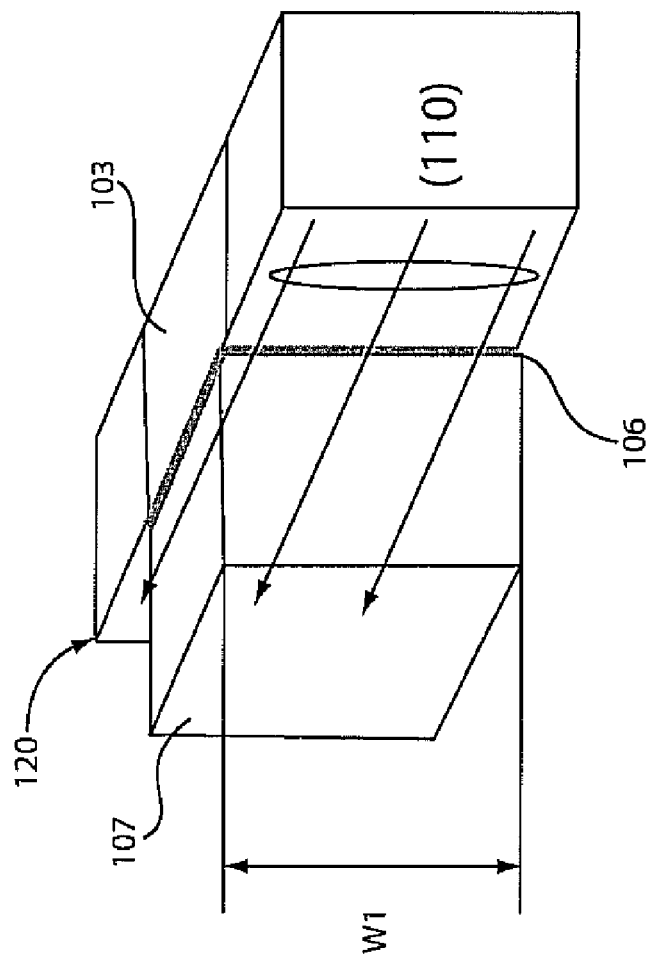
FIG. 11 is a perspective view showing the device of FIG. 10 where the gate conductor is completely removed from the horizontal surface of the silicon island such that the channel is completely on the (110) surface.

FIG. 11 shows a perspective view of the sidewall gate structure 120 with a channel width of W1. In FIG. 12, an angled gate structure 123 is shown. The angled gate structure 123 has a first portion of a channel with width "W1" to permit carriers to transport in the (110) surface, and a second portion of channel width "W2" to permit carriers to transport in the (100) surface.

Figure 13:
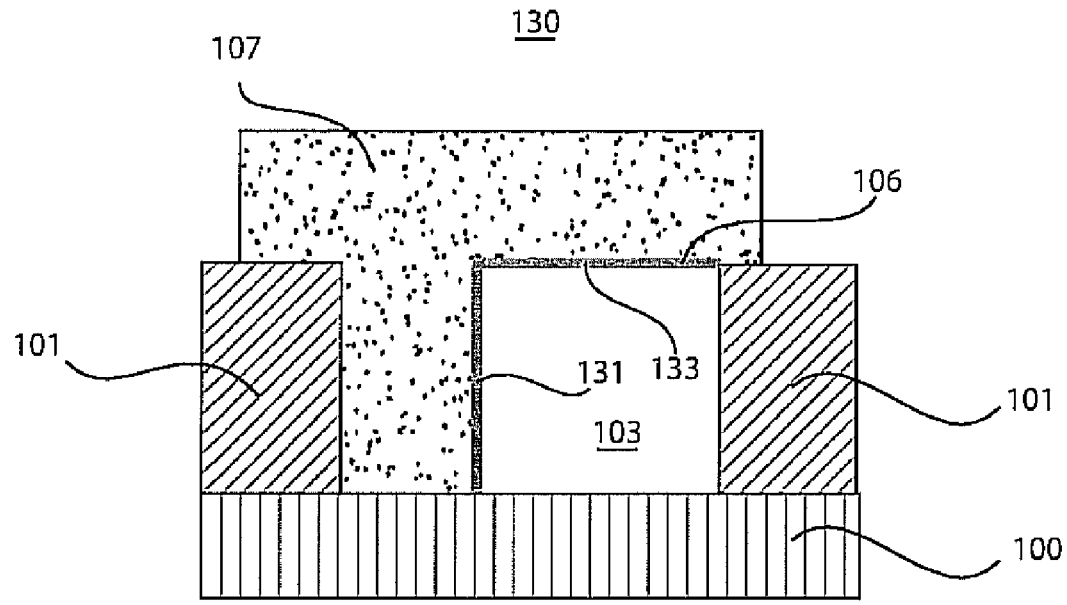
FIG. 13 is a cross-sectional view showing an angle device where the channel width is equal in distance on both the vertical surface and the horizontal surface.

FIG. 13 shows an angled device 130 without a trimming scheme. The channel extends over the (110) surface 131 and the (100) surface 133. The channel dimensions may be controlled by controlling the size/dimensions of the silicon 103. For example, if the dimensions along 131 and 133 are equal than the 50% or the channel is in the (110) surface and 50% or the channel is in the (100) surface.

Figure 14:
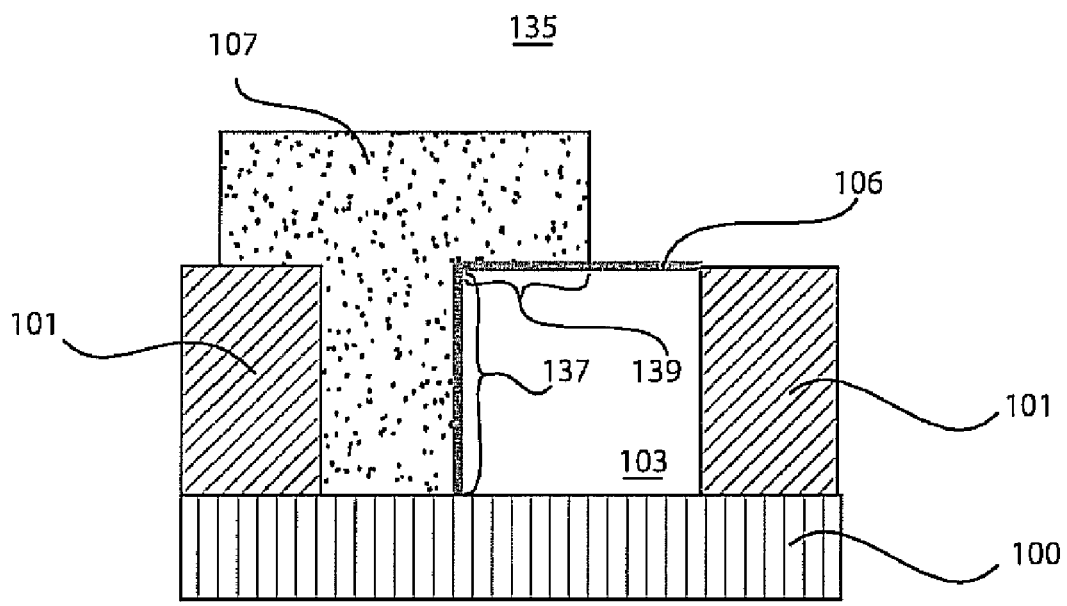
FIG. 14 is a cross-sectional view showing an angle device where the channel width is trimmed to 67% on the vertical surface and 33% on the horizontal surface.

FIG. 14 shows an angled device 135 with a trimming scheme. The channel extends over the (110) surface 137 and the (100) surface 139. The channel dimensions may be controlled by controlling the size/dimensions of the silicon 103 and by trimming the gate conductor 107 as described above. If the dimensions are selected and the gate along 139 is trimmed than the channel may be selectively adjusted. For example, 67% of the channel may be in the (110) surface and 33% or the channel may be in the (100) surface. Other proportions may also be employed.

The following FIGS. will illustratively show an integration process for HOT devices. It should be understood that other structures and materials may be employed instead of, in addition to or in combination with those described and depicted.

Referring to FIG. 15, a SOI wafer 104 has a thin layer of silicon 103 lying on top of a buried oxide layer 100. The buried oxide layer 100 is provided on a silicon substrate 102. The wafer 104 is used as a starting material in accordance with one embodiment.

Referring to FIG. 16, a plurality of silicon islands 103' are formed from layer 103 and surrounded by shallow trench isolation structures 101. As shown in FIG. 17, a cap dielectric film 300 is deposited. The cap film 300 may include an oxide, nitride, oxy-nitride, etc. and may be deposited using a CVD or equivalent process. In FIG. 18, a mask 310 is used to define cavity regions. A photo resist or other mask may be deposited and patterned at the appropriate locations where cavities are to be provided.

Figure 19:
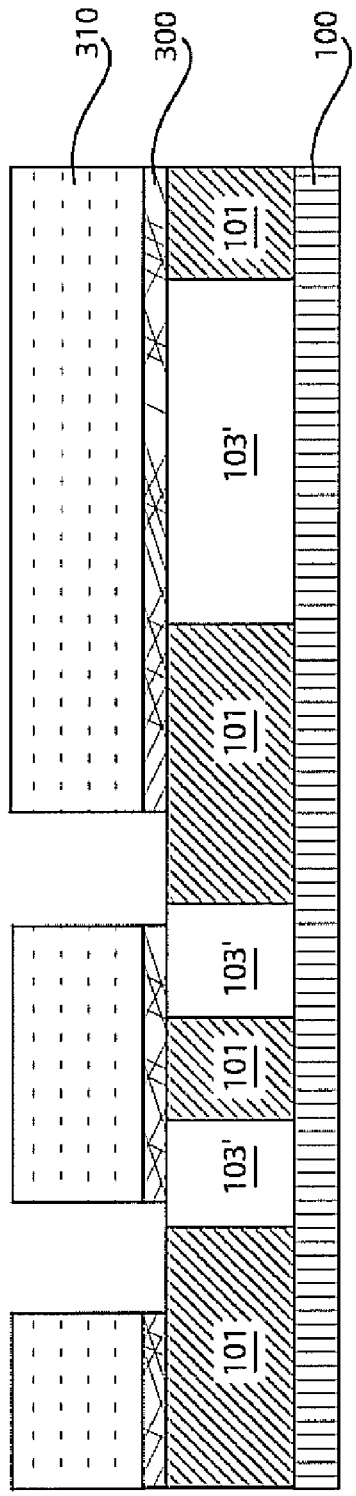
FIG. 19 is a cross-sectional view of the device of FIG. 18 showing the removal of portions of the cap layer.
Figure 20:
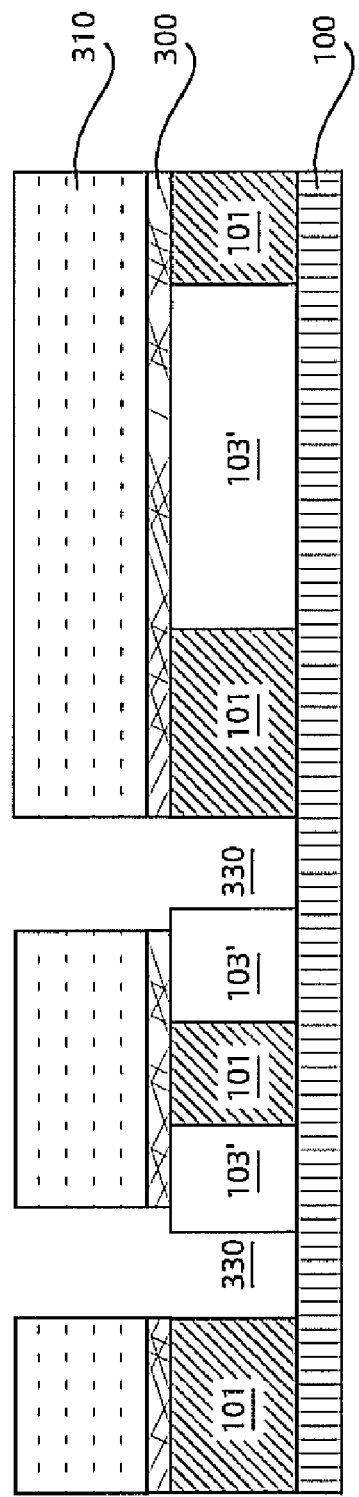
FIG. 20 is a cross-sectional view of the device of FIG. 19 showing the formation of cavities.

Referring to FIGS. 19 and 20, the wafer 104 is etched to remove the exposed cap film 300 in the cavity regions, and the wafer 104 is further etched to remove the exposed STI material 101 to form cavity regions 330. The etching of STI material 101 is selective relative to silicon in regions 103'.

Figure 21:
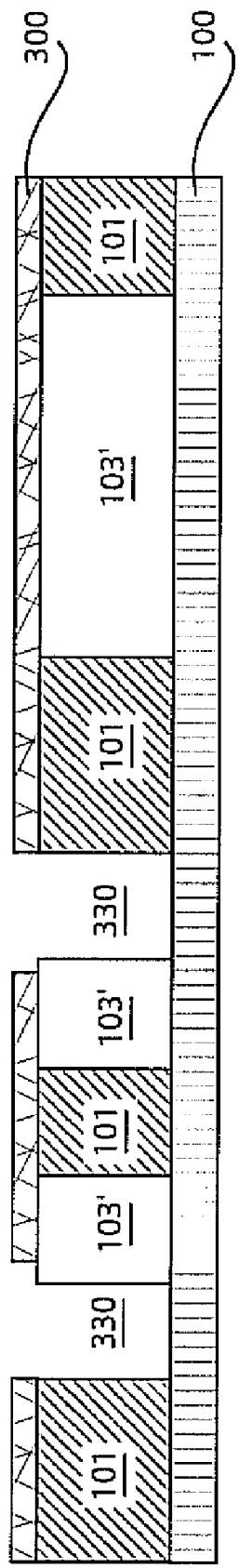
FIG. 21 is a cross-sectional view of the device of FIG. 20 showing the removal of the dielectric layer.
Figure 22:
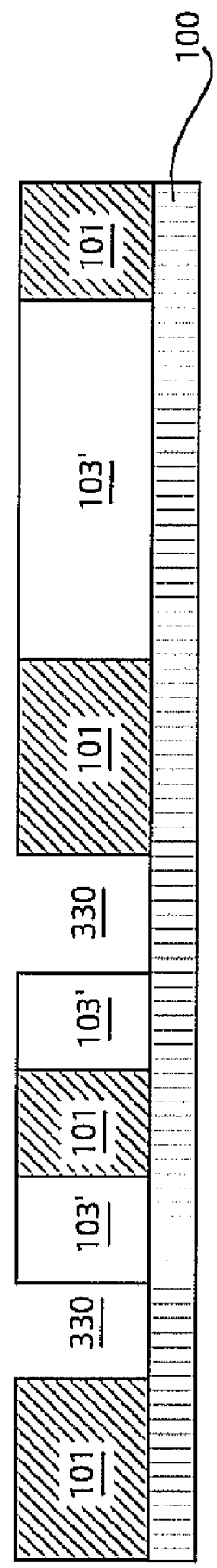
FIG. 22 is a cross-sectional view of the device of FIG. 21 showing the removal of the cap layer.

Referring to FIGS. 21 and 22, the mask 310 (e.g., photoresist) is stripped and the cap film 300 is removed by selective dry or wet etching. In FIGS. 23 and 24, a gate oxide 106 is formed on the exposed silicon surface of regions 103', and a conductive gate material 107 is deposited.

Referring to FIG. 25, a photo-resist mask 322 is applied and employed to define both angled gate devices 370A, 370B as well as horizontal planar gate devices 380. Gate material 107 is patterned by a selective etching process to form angled gates 371 and 372 and a planar gate 373, concurrently.

Figure 27:
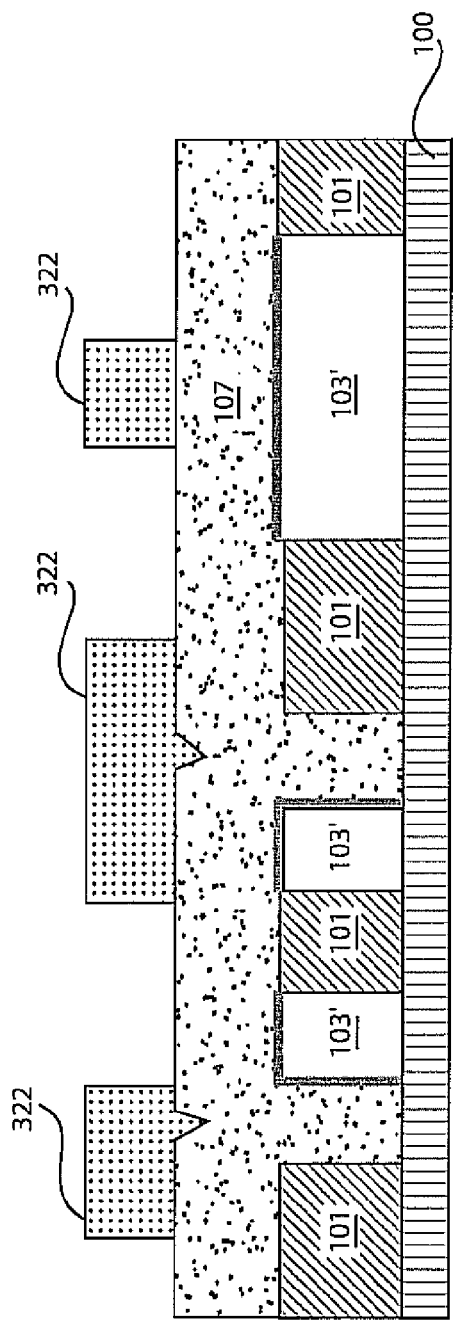
FIG. 27 is a cross-sectional view of the device of FIG. 25 showing an alternative patterning mask for forming angle devices and trimmed (vertical channel only) devices.
Figure 28:
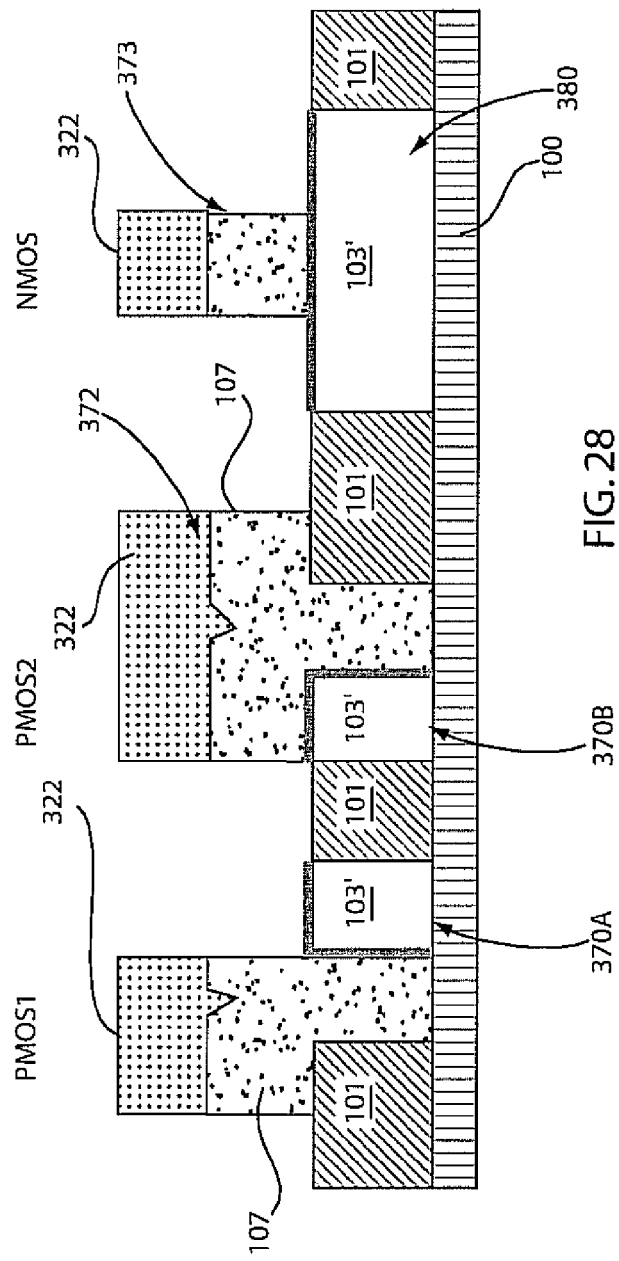
FIG. 28 is a cross-sectional view of the device of FIG. 27 showing the patterning of the gate conductor.

Referring to FIGS. 27 and 28, an alternative pattern may optionally be formed in layer 322 to form different channel dimensions using a trimming process. Layer 322 is adjusted to modify the gate structures of device 370A to make device 370A a sidewall gate PMOS1, device 370B an angled gate PMOS2 and device 380 a planar gate NMOS. Any combination of these devices any amount of trimming may be provided in accordance with the present principles.

Referring to FIG. 29, after patterning the gate conductor material 107 (as depicted in either FIG. 26 or 28), a block-out mask 375 may be employed to conduct source/drain implantations on the PMOS devices 370A and 370B. The block-out mask 375 protects other devices (e.g., device 380) or components from the dopants during implantation. In FIG. 30, another block-out mask 385 can be used to conduct source/drain (S/D) implants on the NMOS devices 380.

Figure 31:
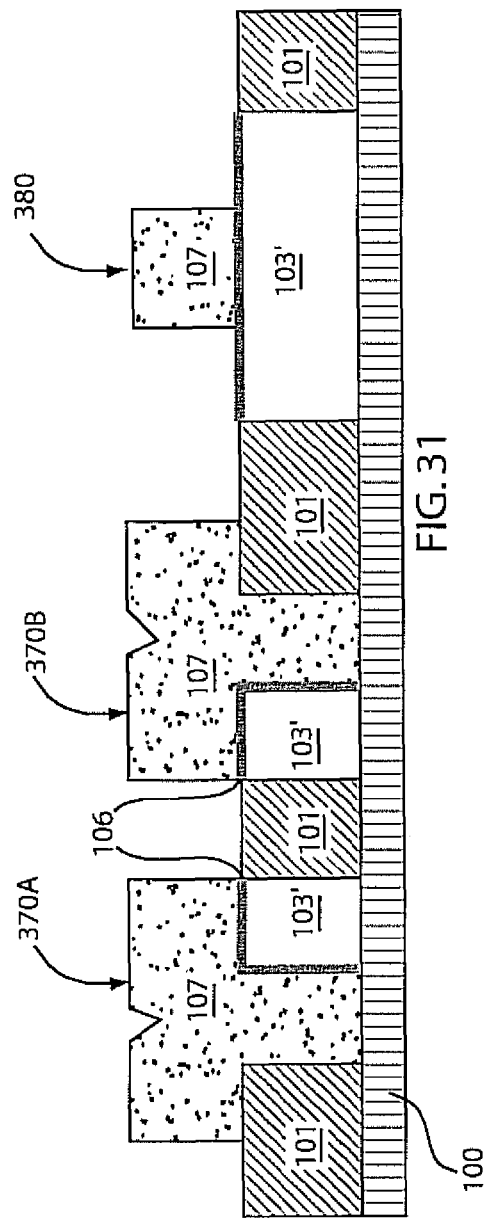
FIG. 31 is a cross-sectional view of the device of FIG. 30 showing the devices after implantation of sources and drains.
Figure 32:
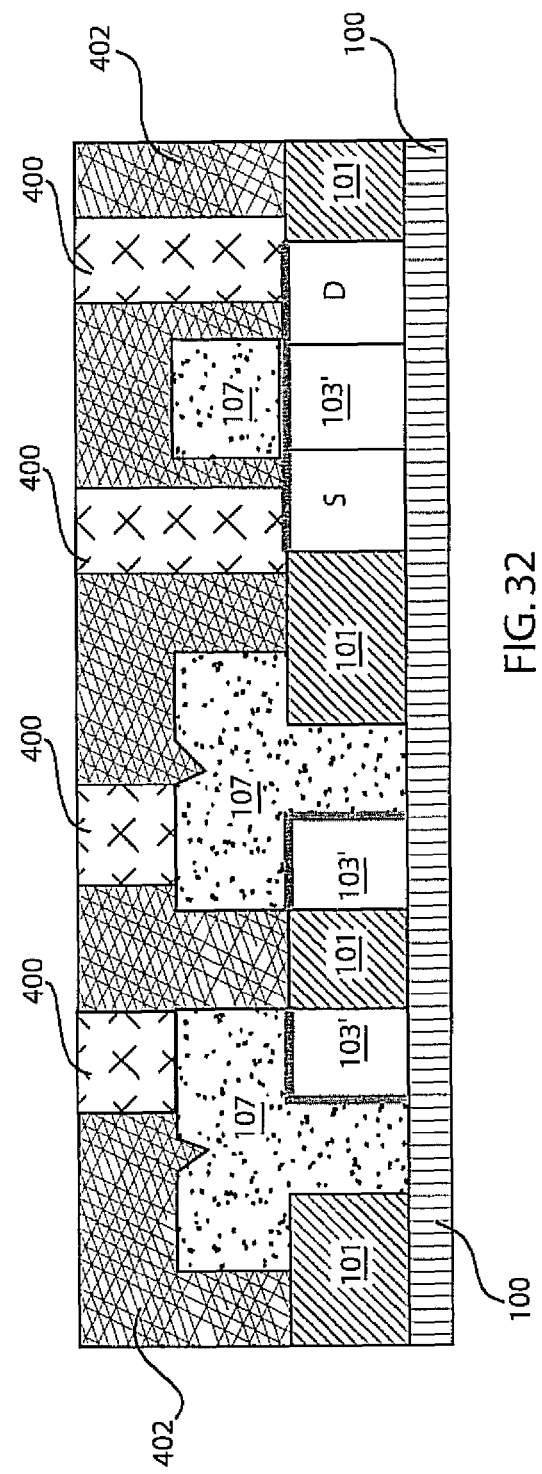
FIG. 32 is a cross-sectional view of the device of FIG. 31 showing contacts formed through a dielectric layer for connecting to the devices.

Referring to FIG. 31, Angled PMOS devices 370A and 370B and planar NMOS device 380 are formed side-by-side. After formation of device 370A, 370B and 380, conventional back end of line (BEOL) process steps are applied to form contacts 400 through a dielectric layer 402 to the devices 370A, 370B and 380, as shown in FIG. 32.

Referring to FIG. 33A, a cross-sectional view of a device 450 having angled device 420, sidewall device 430 and planar device 440 together in a side-by-side configuration is illustratively depicted. A channel width is indicated by "W" for angled device 420.

Referring to FIG. 33B, a top view of the device 450 of FIG. 33A is shown with dielectric layers removed to permit viewing of component regions. Angle device 420 includes a channel length indicated by "L". Other configurations, aspect ratios, and layouts are also contemplated for these devices and for combinations of these devices.

Referring to FIGS. 34A and 34B, cross-sectional and top views of a device 550 with angled devices 520 and 530 and planar device 540 are shown in accordance with a different configuration. Angled device 530 and planar device 540 share a gate (conductive material 107) activated by a single contact (400).

Figure 35:
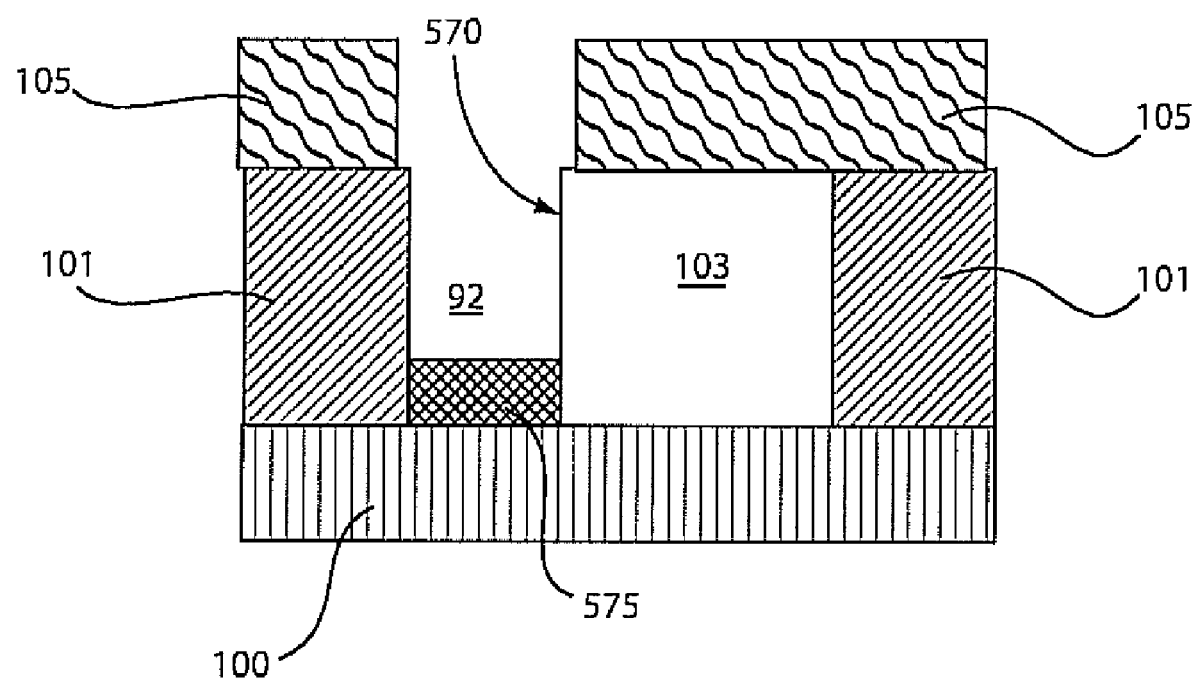
FIG. 35 is a cross-sectional view showing an angle device with material to reduce a channel width on a vertical surface.
Figure 36:
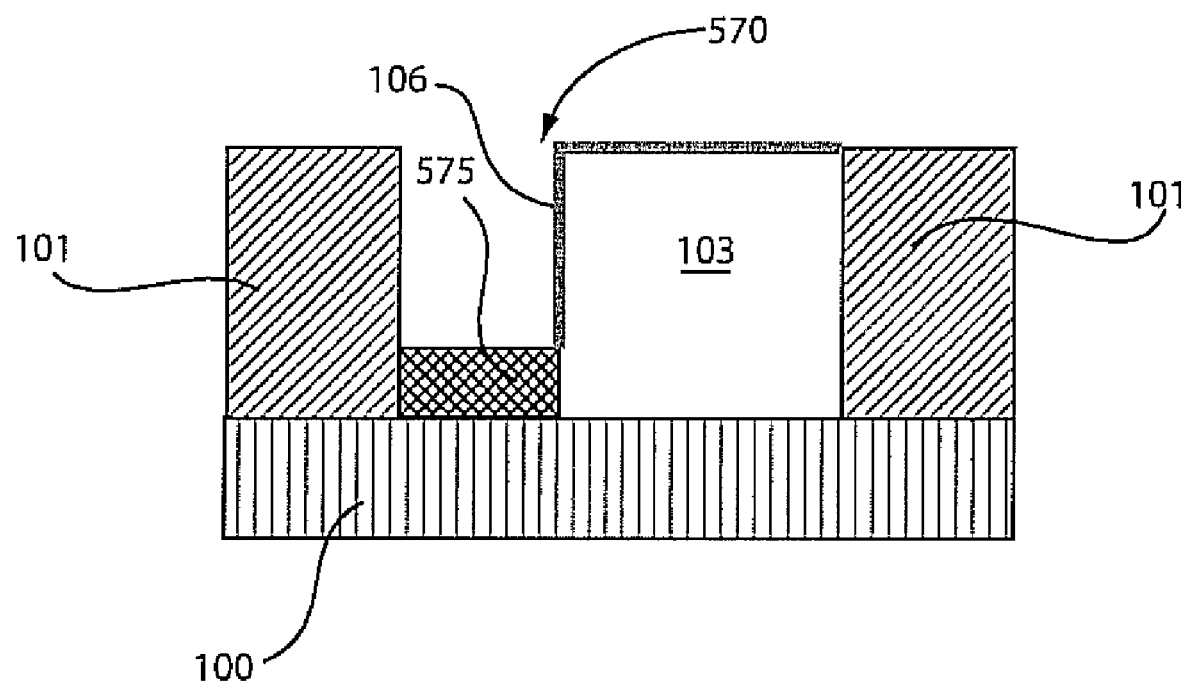
FIG. 36 is a cross-sectional view showing the angle device of FIG. 35 with a gate oxide formed where a channel will be provided.

Other embodiments may exist which permit the adjustment of the channel for angled devices. One example is depicted in FIGS. 35 and 36. FIG. 35 includes cavity 92 formed in a similar way to that shown in FIG. 3A. However, the etching process may be halted early or a separate deposition process may be employed to maintain material 575 adjacent to semiconductor 103. In this way, the width of a channel formed on a sidewall 570 may be controlled thereby controlling the amount of channel area on the (110) surface as depicted in FIG. 36. Material 575 may include the etched portion of STI material 101 or a separately deposited dielectric material. The height of the material 575 relative to semiconductor 103 will serve to control the channel width along the vertical surface 570.

It should be understood that the surface (110) and (100) may be interchangeable one with the other depending on how a given device is formed in a semiconductor substrate or material.

Having described preferred embodiments of a defect-free hybrid orientation technology for semiconductor devices (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for forming an angle device, comprising: forming a silicon island surrounded by an isolation region on a silicon-on-insulator (SOI) wafer; forming a cavity adjacent to the silicon island to expose at least two silicon surfaces where each surface has a different crystallographic orientation and a respective surface dimension;

forming a gate oxide on the at least two silicon surfaces to define a device channel having a channel dimension on each of the surfaces such that the device channel extends over the at least two silicon surfaces with at least one of the channel dimensions being formed on less than the respective surface dimension; and forming a gate conductor by depositing the gate conductor over the at least two silicon surfaces.

2. The method as recited in claim 1, further comprising forming source and drain implant regions for the angle devices.

3. The method as recited in claim 1, further comprising trimming a channel width of the device channel by removing a portion of the gate conductor.

4. A method for integrating angle devices and planar devices on a same chip, comprising: forming a plurality of silicon islands surrounded by isolation regions on a silicon-on-insulator (SOI) wafer; forming a plurality of cavities adjacent to the silicon islands to expose at least two silicon surfaces where each surface has a different crystallographic orientation and a respective surface dimension; forming a gate oxide on the at least two silicon surfaces to define a device channel having a channel dimension on each of the surfaces such that the device channel extends over the at least two silicon surfaces for angle devices, wherein at least one of the channel dimensions is formed on less than the respective surface dimension of the angle device, and concurrently forming a gate oxide on at least one planar device; and forming gate conductors for the angle devices by depositing the gate conductors over the at least two silicon surfaces and concurrently forming gate conductors for the planar devices by depositing gate conductors over one surface of each planar device.

5. The method as recited in claim 4, further comprising forming source and drain implant regions for the angle devices and the planar devices.

6. The method as recited in claim 5, forming block-out masks for one of angled device implantation and planar device implantation processing.

7. The method as recited in claim 4, further comprising trimming a channel width of the angled devices by removing a portion of the gate conductor.

8. The method as recited in claim 7, wherein trimming includes removing an entire horizontal portion of the gate conductor such that the device channel of the device forms only on a vertical sidewall.

9. The method as recited in claim 4, wherein the angled devices include PMOS devices and the planar devices include NMOS devices.

* * * * *